United States Patent
Hoshino et al.

(10) Patent No.: US 11,789,374 B2
(45) Date of Patent: Oct. 17, 2023

(54) EXTREME ULTRAVIOLET LIGHT GENERATION APPARATUS AND ELECTRONIC DEVICE MANUFACTURING METHOD

(71) Applicant: Gigaphoton Inc., Tochigi (JP)

(72) Inventors: Yusuke Hoshino, Oyama (JP); Yukio Watanabe, Oyama (JP); Toshihiro Nishisaka, Oyama (JP); Atsushi Ueda, Oyama (JP); Koichiro Koge, Oyama (JP); Takayuki Osanai, Oyama (JP); Gouta Niimi, Oyama (JP)

(73) Assignee: Gigaphoton Inc., Tochigi (JP)

( * ) Notice: Subject to any disclaimer, the term of this patent is extended or adjusted under 35 U.S.C. 154(b) by 304 days.

(21) Appl. No.: 17/397,554

(22) Filed: Aug. 9, 2021

(65) Prior Publication Data

US 2022/0082927 A1 Mar. 17, 2022

(30) Foreign Application Priority Data

Sep. 16, 2020 (JP) ................ 2020-155239

(51) Int. Cl.
G03F 7/00 (2006.01)
H05G 2/00 (2006.01)

(52) U.S. Cl.
CPC ...... *G03F 7/70916* (2013.01); *G03F 7/70033* (2013.01); *H05G 2/006* (2013.01); *H05G 2/008* (2013.01)

(58) Field of Classification Search
CPC . G03F 7/70916; G03F 7/70033; H05G 2/006; H05G 2/008
See application file for complete search history.

(56) References Cited

U.S. PATENT DOCUMENTS

| | | |
|---|---|---|
| 2002/0014598 A1 | 2/2002 | Melnychuk et al. |
| 2008/0099699 A1 | 5/2008 | Yabuta et al. |
| 2009/0230326 A1 | 9/2009 | Vaschenko et al. |
| 2013/0234597 A1 | 9/2013 | Kusunose et al. |
| 2014/0226772 A1 | 8/2014 | Watari et al. |

FOREIGN PATENT DOCUMENTS

| | | |
|---|---|---|
| WO | 2015/086232 A1 | 6/2015 |
| WO | 2017/217882 A1 | 12/2017 |

OTHER PUBLICATIONS

A Search Report issued by the Netherlands Patent Office dated Jun. 5, 2023, which corresponds to Dutch Patent Application No. 2032486 and is related to U.S. Appl. No. 17/397,554.
A Search Report issued by the Netherlands Patent Office dated May 17, 2022, which corresponds to Dutch Patent Application No. 2028940 and is related to U.S. Appl. No. 17/397,554; with partial English language explanation.

*Primary Examiner* — Nicole M Ippolito
*Assistant Examiner* — Hanway Chang
(74) *Attorney, Agent, or Firm* — Studebaker & Brackett PC

(57) ABSTRACT

An extreme ultraviolet light generation apparatus may include a chamber, a first partition wall covering a plasma generation region in the chamber and having a first opening, an EUV light concentrating mirror located in a first space inside the chamber and outside the first partition wall and configured to concentrate extreme ultraviolet light generated in the plasma generation region and having passed through the first opening, a first gas supply port formed at the chamber and configured to supply gas to the first space, and a gas exhaust port formed in the first partition wall and configured to exhaust gas in a second space inside the first partition wall to outside of both the first partition wall and the chamber.

20 Claims, 13 Drawing Sheets

EXTREME ULTRAVIOLET LIGHT GENERATION APPARATUS AND ELECTRONIC DEVICE MANUFACTURING METHOD

CROSS-REFERENCE TO RELATED APPLICATIONS

The present application claims the benefit of Japanese Patent Application No. 2020-155239, filed on Sep. 16, 2020, the entire contents of which are hereby incorporated by reference.

BACKGROUND

1. Technical Field

The present disclosure relates to an extreme ultraviolet light generation apparatus and an electronic device manufacturing method.

2. Related Art

Recently, miniaturization of a transfer pattern in optical lithography of a semiconductor process has been rapidly proceeding along with miniaturization of the semiconductor process. In the next generation, microfabrication at 70 to 45 nm and further at 32 nm or less will be required. Therefore, in order to meet the demand for fine processing of, for example, 32 nm or less, the development of an exposure apparatus that combines an extreme ultraviolet (EUV) light generation apparatus that generates EUV light having a wavelength of about 13 nm and reduced projection reflection optics is expected.

As an EUV light generation apparatus, three types of apparatuses have been proposed: a laser produced plasma (LPP) type apparatus using plasma generated by irradiating a target substance with pulse laser light, a discharge produced plasma (DPP) type apparatus using plasma generated by discharge, and a synchrotron radiation (SR) type apparatus using synchrotron radiation.

LIST OF DOCUMENTS

Patent Documents

Patent Document 1: US Patent Application Publication No. 2009/0230326
Patent Document 2: US Patent Application Publication No. 2014/0226772

SUMMARY

An extreme ultraviolet light generation apparatus according to an aspect of the present disclosure includes a chamber, a first partition wall covering a plasma generation region in the chamber and having a first opening, an EUV light concentrating mirror located in a first space inside the chamber and outside the first partition wall and configured to concentrate extreme ultraviolet light generated in the plasma generation region and having passed through the first opening, a first gas supply port formed at the chamber and configured to supply gas to the first space, and a gas exhaust port formed in the first partition wall and configured to exhaust gas in a second space inside the first partition wall to outside of both the first partition wall and the chamber.

An electronic device manufacturing method according to an aspect of the present disclosure includes generating extreme ultraviolet light using an extreme ultraviolet light generation apparatus, emitting the extreme ultraviolet light to an exposure apparatus, and exposing a photosensitive substrate to the extreme ultraviolet light in the exposure apparatus to manufacture an electronic device. Here, the extreme ultraviolet light generation apparatus includes a chamber, a first partition wall covering a plasma generation region in the chamber and having a first opening, an EUV light concentrating mirror located in a first space inside the chamber and outside the first partition wall and configured to concentrate the extreme ultraviolet light generated in the plasma generation region and having passed through the first opening, a first gas supply port formed at the chamber and configured to supply gas to the first space, and a gas exhaust port formed in the first partition wall and configured to exhaust gas in a second space inside the first partition wall to outside of both the first partition wall and the chamber.

An electronic device manufacturing method according to an aspect of the present disclosure includes inspecting a defect of a mask by irradiating the mask with extreme ultraviolet light generated by an extreme ultraviolet light generation apparatus, selecting a mask using a result of the inspection, and exposing and transferring a pattern formed on the selected mask onto a photosensitive substrate. Here, the extreme ultraviolet light generation apparatus includes a chamber, a first partition wall covering a plasma generation region in the chamber and having a first opening, an EUV light concentrating mirror located in a first space inside the chamber and outside the first partition wall and configured to concentrate the extreme ultraviolet light generated in the plasma generation region and having passed through the first opening, a first gas supply port formed at the chamber and configured to supply gas to the first space, and a gas exhaust port formed in the first partition wall and configured to exhaust gas in a second space inside the first partition wall to outside of both the first partition wall and the chamber.

BRIEF DESCRIPTION OF THE DRAWINGS

Embodiments of the present disclosure will be described below merely as examples with reference to the accompanying drawings.

DESCRIPTION OF EMBODIMENTS

Figure 1:
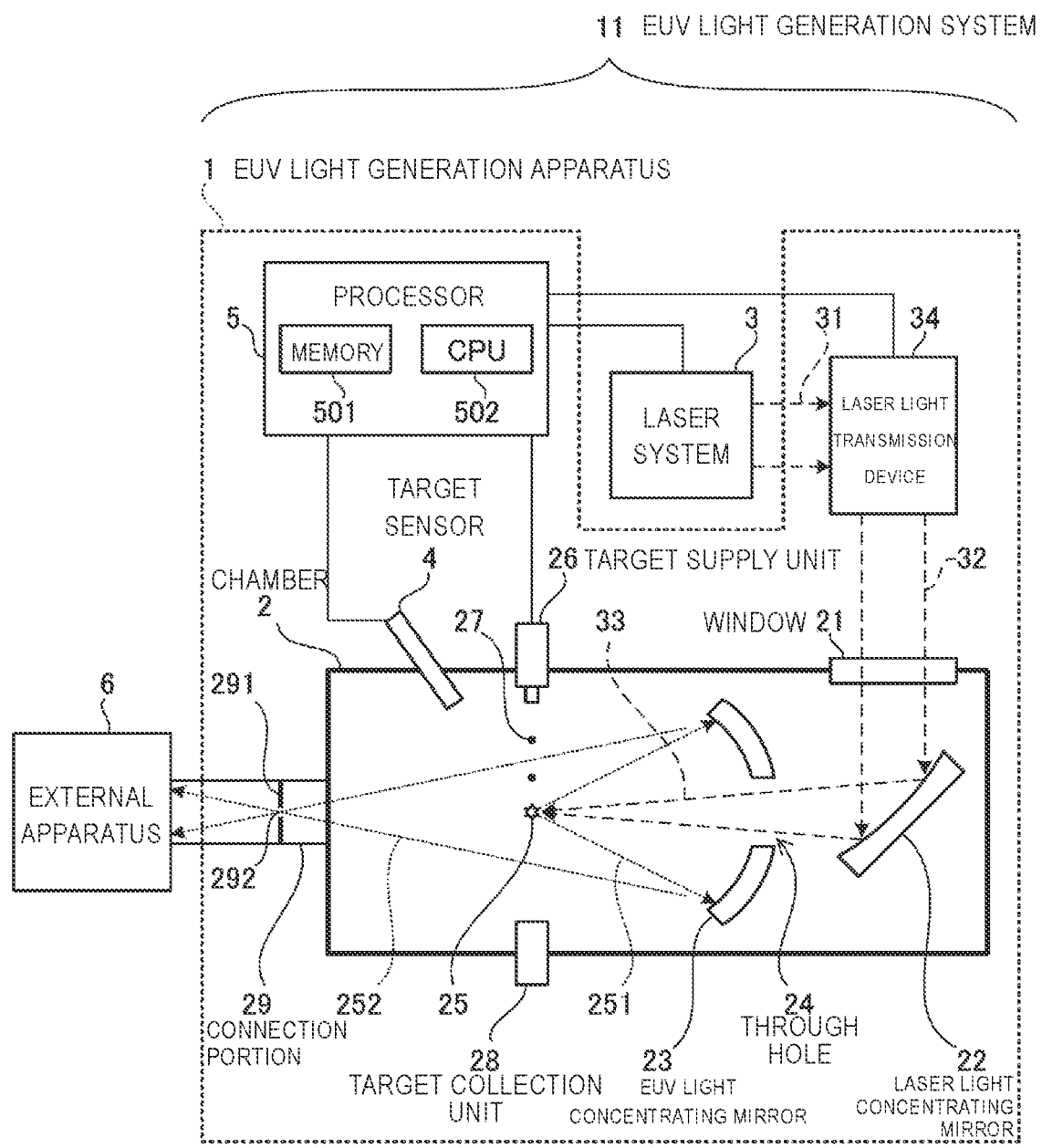
FIG. 1 schematically shows an exemplary configuration of an LPP EUV light generation system.

<Contents>
1. Overall description of EUV light generation system 11
    1.1 Configuration
    1.2 Operation
2. EUV light generation apparatus 1a according to comparative example
    2.1 Configuration
    2.2 Operation
    2.3 Problem
3. EUV light generation apparatus 1b having first partition wall 37 arranged in chamber 2b
    3.1 Configuration
    3.2 Operation
    3.3 Effect
4. EUV light generation apparatus 1c in which first partition wall 37c includes fourth opening 374 for sensor 4d
    4.1 Configuration
    4.2 Operation and effect
5. EUV light generation apparatus 1d including second partition wall 2d
    5.1 Configuration
    5.2 Operation
    5.3 Effect
6. EUV light generation apparatus 1e in which first partition wall 37e includes heater
    6.1 Configuration
    6.2 Operation
    6.3 Other configuration examples
    6.4 Effect
7. EUV light generation apparatus 1f in which moving direction of target 27 and gas is gravity direction
    7.1 Configuration
    7.2 Operation
    7.3 Effect
8. EUV light generation apparatus 1g in which first partition wall 37g includes flange 37h
    8.1 Configuration and operation
    8.2 Effect
9. EUV light generation apparatus 1h in which first partition wall 37i includes flange 37h
    9.1 Configuration and operation
    9.2 First example
    9.3 Second example
    9.4 Effect
10. Others Hereinafter, embodiments of the present disclosure will be described in detail with reference to the drawings. The embodiments described below show some examples of the present disclosure and do not limit the contents of the present disclosure. Also, all configurations and operation described in the embodiments are not necessarily essential as configurations and operation of the present disclosure. Here, the same components are denoted by the same reference numerals, and duplicate description thereof is omitted.

1. Overall Description of EUV Light Generation System 11

1.1 Configuration

FIG. 1 schematically shows an exemplary configuration of an LPP EUV light generation system 11. An EUV light generation apparatus 1 is used together with a laser system 3. In the present disclosure, a system including the EUV light generation apparatus 1 and the laser system 3 is referred to as the EUV light generation system 11. The EUV light generation apparatus 1 includes a chamber 2 and a target supply unit 26. The chamber 2 is a sealable container. The target supply unit 26 supplies a target substance into the chamber 2. The material of the target substance may include tin, terbium, gadolinium, lithium, xenon, or a combination of any two or more thereof.

A through hole is formed in a wall of the chamber 2. The through hole is blocked by a window 21 through which pulse laser light 32 emitted from the laser system 3 passes. An EUV light concentrating mirror 23 having a spheroidal reflection surface is arranged in the chamber 2. The EUV light concentrating mirror 23 has first and second focal points. A multilayer reflection film in which molybdenum and silicon are alternately stacked is formed on a surface of the EUV light concentrating mirror 23. The EUV light concentrating mirror 23 is arranged such that the first focal point is located in a plasma generation region 25 and the second focal point is located at an intermediate focal point 292. A through hole 24 is formed at the center of the EUV light concentrating mirror 23, and pulse laser light 33 passes through the through hole 24.

The EUV light generation apparatus 1 includes a processor 5, a target sensor 4, and the like. The processor 5 is a processing device including a memory 501 in which a control program is stored, and a central processing unit (CPU) 502 for executing the control program. The processor 5 is specifically configured or programmed to perform various processes included in the present disclosure. The target sensor 4 detects at least one of the presence, trajectory, position, and velocity of a target 27. The target sensor 4 may have an imaging function.

Further, the EUV light generation apparatus 1 includes a connection portion 29 providing communication between the inside of the chamber 2 and the inside of an external apparatus 6. A wall 291 in which an aperture is formed is arranged in the connection portion 29. The wall 291 is arranged such that the aperture is located at the second focal point of the EUV light concentrating mirror 23.

Furthermore, the EUV light generation apparatus 1 includes a laser light transmission device 34, a laser light concentrating mirror 22, a target collection unit 28 for collecting the target 27, and the like. The laser light transmission device 34 includes an optical element for defining a transmission state of laser light, and an actuator for adjusting the position, posture, and the like of the optical element.

1.2 Operation

Operation of the EUV light generation system 11 will be described with reference to FIG. 1. Pulse laser light 31 emitted from the laser system 3 enters, via the laser light transmission device 34, the chamber 2 through the window 21 as the pulse laser light 32. The pulse laser light 32 travels along a laser light path in the chamber 2, is reflected by the laser light concentrating mirror 22, and is radiated to the target 27 as the pulse laser light 33.

The target supply unit 26 supplies the target 27 containing the target substance to the plasma generation region 25 in the chamber 2. The target 27 is irradiated with the pulse laser light 33. The target 27 irradiated with the pulse laser light 33 is turned into plasma, and radiation light 251 is radiated from the plasma. EUV light contained in the radiation light 251 is reflected by the EUV light concentrating mirror 23 with higher reflectance than light in other wavelength ranges. Reflection light 252 including the EUV light reflected by the EUV light concentrating mirror 23 is concentrated on the intermediate focal point 292 and output to the external apparatus 6. Here, one target 27 may be irradiated with a plurality of pulses included in the pulse laser light 33.

The processor 5 controls the entire EUV light generation system 11. The processor 5 processes a detection result of the target sensor 4. Based on the detection result of the target sensor 4, the processor 5 controls the timing at which the target 27 is output, the output direction of the target 27, and the like. Furthermore, the processor 5 controls the oscillation timing of the laser system 3, the travel direction of the pulse laser light 32, the concentrating position of the pulse laser light 33, and the like. Such various kinds of control described above are merely exemplary, and other control may be added as necessary.

2. EUV Light Generation Apparatus 1a According to Comparative Example

2.1 Configuration

Figure 2:
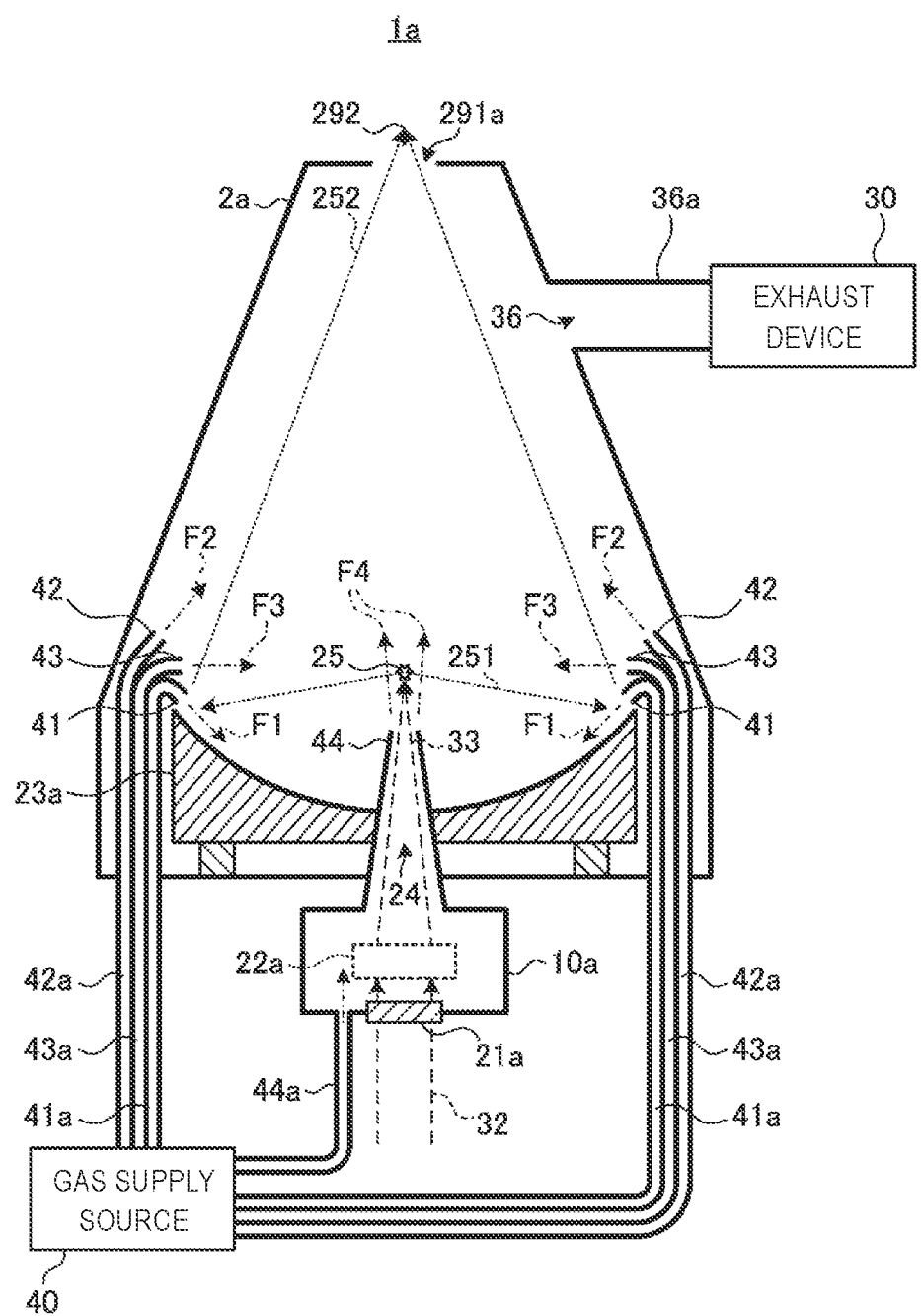
FIG. 2 schematically shows the configuration of the EUV light generation apparatus according to a comparative example.

FIG. 2 schematically shows the configuration of an EUV light generation apparatus 1a according to a comparative example. The EUV light generation apparatus 1a includes a chamber 2a, a sub-chamber 10a, an EUV light concentrating mirror 23a, an exhaust device 30, and a gas supply source 40.

The chamber 2a has a substantially conical shape. An aperture 291a is formed at the small-diameter end part of the chamber 2a. An EUV light concentrating mirror 23a is fixed to the large-diameter end part of the chamber 2a.

The gas supply source 40 is connected to the sub-chamber 10a through a pipe 44a. A window 21a for transmitting the pulse laser light 32 is arranged at the sub-chamber 10a. Further, a laser light concentrating optical system 22a is arranged in the sub-chamber 10a. The sub-chamber 10a is connected to a cylindrical laser light path wall 44. The laser light path wall 44 penetrates the through hole 24 of the EUV light concentrating mirror 23a and a through hole at the large-diameter end of the chamber 2a. The pulse laser light 33 having passed through the laser light concentrating optical system 22a can pass through the inside of the laser light path wall 44.

The gas supply source 40 is further connected to first to third nozzles 41 to 43 in the chamber 2a through pipes 41a to 43a. The first to third nozzles 41 to 43 are arranged on the outer peripheral portion of the EUV light concentrating mirror 23a.

The gas supply source 40 includes a gas cylinder (not shown). The gas supplied by the gas supply source 40 to the sub-chamber 10a and the chamber 2a includes etching gas or inert gas. The etching gas includes hydrogen gas. Inert gas includes, for example, helium gas.

The exhaust device 30 is connected to an exhaust pipe 36a. The exhaust pipe 36a is connected to the inside of the chamber 2a through an exhaust port 36 formed at the chamber 2a. The exhaust pipe 36a may further be connected to a particulate trap or a detoxification device (not shown).

2.2 Operation

The target 27 supplied to the plasma generation region 25 (see FIG. 1) is irradiated with the pulse laser light 33 having passed through the inside of the laser light path wall 44. When the target 27 is irradiated with the pulse laser light 33, the target substance is turned into plasma, and radiation light 251 is radiated from the plasma. In the plasma generation region 25, debris including ions and neutral particles of the target substance is also generated. Debris of the target substance diffuses in the chamber 2a.

The gas supply source 40 supplies gas into the sub-chamber 10a. Owing to the gas supplied into the sub-chamber 10a, the pressure in the sub-chamber 10a becomes higher than the pressure in the chamber 2a. The gas supplied into the sub-chamber 10a flows out toward the plasma generation region 25 and the vicinity thereof through the inside of the laser light path wall 44. The flow of gas out of the laser light path wall 44 is indicated by an arrow F4.

By making the pressure in the sub-chamber 10a higher than the pressure in the chamber 2a, it is possible to suppress debris of the target substance from entering the sub-chamber 10a. Even if debris of the target substance enters the sub-chamber 10a, when the gas supplied from the gas supply source 40 to the sub-chamber 10a is etching gas, it is possible to suppress the debris of the target substance from being deposited on the laser light concentrating optical system 22a.

The gas supply source 40 also supplies gas to the first to third nozzles 41 to 43 in the chamber 2a. The gas supplied to the first to third nozzles 41 to 43 flows in the directions of arrows F1 to F3, respectively.

By contriving the directions and flow rates of the gas flowing out from the first to third nozzles 41 to 43 and the gas flowing out of the laser light path wall 44, it is possible to suppress debris of the target substance from reaching the EUV light concentrating mirror 23a. Even if debris of the target substance reaches the EUV light concentrating mirror 23a, when the gas supplied from the gas supply source 40 to the first nozzle 41 is etching gas, it is possible to suppress the debris of the target substance from being deposited on the EUV light concentrating mirror 23a.

The exhaust device 30 exhausts the inside of the chamber 2a to a predetermined pressure lower than the atmospheric pressure. Along with the gas exhaust, debris of the target substance is also discharged to the outside of the chamber 2a.

2.3 Problem

In the comparative example, by controlling the gas flow, deposition of debris of the target substance on the EUV light concentrating mirror 23a is suppressed. However, if there is a region where the gas flow is stagnant, debris of the target substance may be deposited in the vicinity thereof. To prevent the deposition of debris, it is necessary to control the gas flow at a high level for preventing the gas stagnation, and the gas nozzle is required to have a complicated structure and the flow rate is required to be controlled with high accuracy.

In some embodiments described below, a first partition wall 37 covering the plasma generation region 25 is arranged in a chamber 2b. The first partition wall 37 has a first opening 371 through which the EUV light passes. The gas is supplied to a first space 20a inside the chamber 2b and outside the first partition wall 37, and the gas in a second space 20b inside the first partition wall 37 is exhausted. Thus, debris of the target substance is suppressed from being deposited on an EUV light concentrating mirror 23b.

3. EUV Light Generation Apparatus 1b Having First Partition Wall 37 Arranged in Chamber 2b

3.1 Configuration

Figure 3:
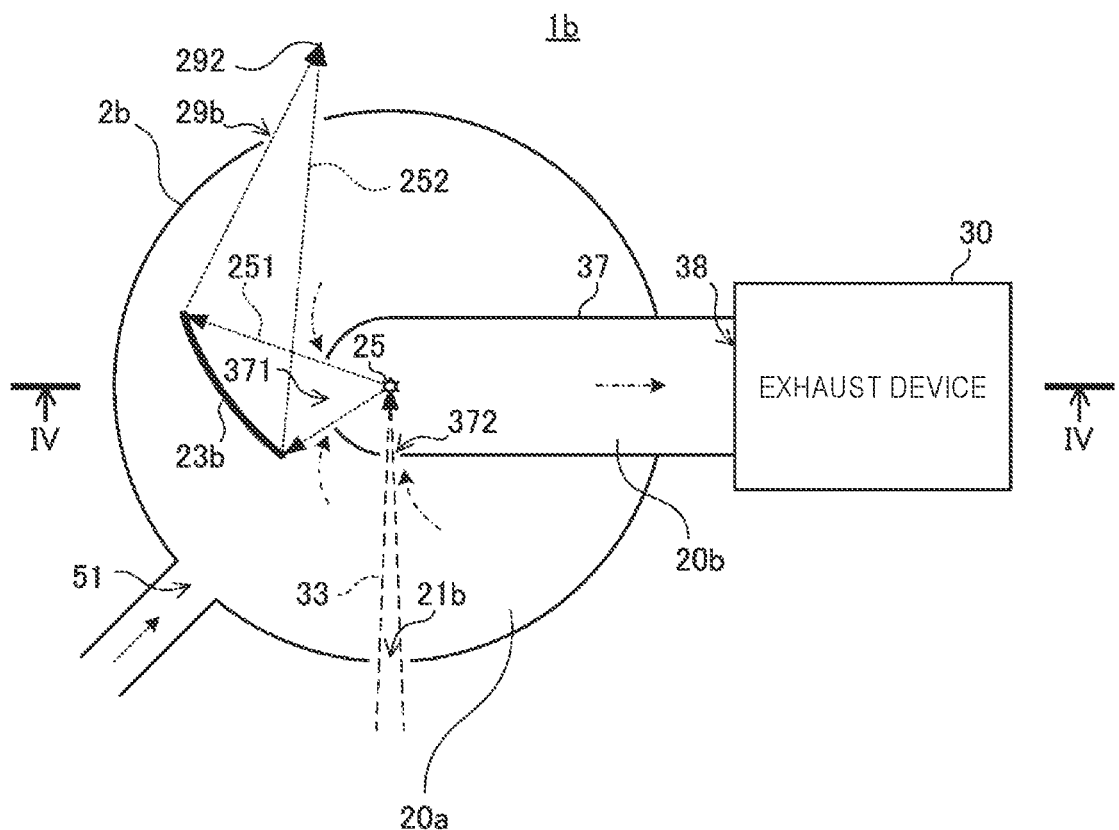
FIG. 3 is a sectional view showing the configuration of the EUV light generation apparatus according to a first embodiment.
Figure 4:
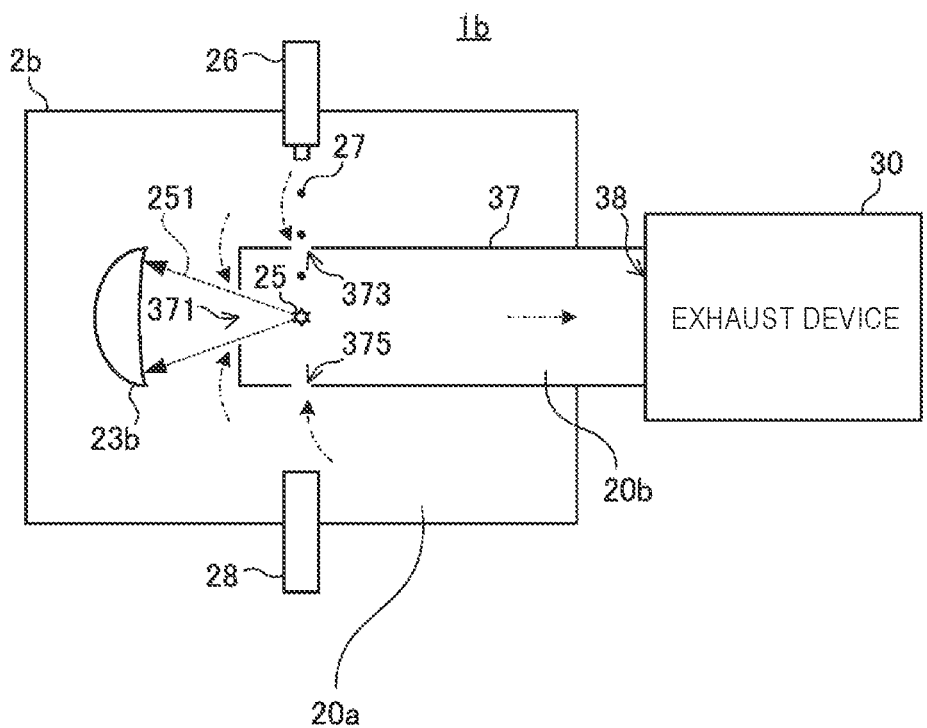
FIG. 4 is a sectional view showing the configuration of the EUV light generation apparatus according to the first embodiment.

FIGS. 3 and 4 are sectional views showing the configuration of an EUV light generation apparatus 1b according to a first embodiment. FIG. 3 shows a cross-section perpendicular to the trajectory of the target 27, and FIG. 4 shows a cross-section perpendicular to the optical path axis of the pulse laser light 33. FIG. 4 corresponds to a sectional view taken along line IV-IV of FIG. 3, and since the line IV-IV is located substantially at the center of the EUV light concentrating mirror 23b, the EUV light concentrating mirror 23b is shown in a substantially semi-elliptical shape in FIG. 4.

The EUV light generation apparatus 1b includes the chamber 2b, the EUV light concentrating mirror 23b, the first partition wall 37, a first gas supply port 51, and a gas exhaust port 38.

The chamber 2b has a substantially cylindrical shape. The target supply unit 26 and the target collection unit 28 are arranged at positions on the center axis of the cylindrical shape outside the first partition wall 37. The plasma generation region 25 is located at a position between the target supply unit 26 and the target collection unit 28 inside the first partition wall 37. A window 21b for transmitting the pulse laser light 33 is arranged at the chamber 2b. The window 21b may be an opening.

The first partition wall 37 is made of stainless steel or metal molybdenum. The first partition wall 37 has a cylindrical shape, and the first partition wall 37 penetrates the side surface of the chamber 2b. A part of the first partition wall 37 is located in the chamber 2b and is arranged so as to cover the plasma generation region 25. In the chamber 2b, the first partition wall 37 has a first opening 371, a second opening 372, a third opening 373, and a sixth opening 375. A fourth opening will be described later in a second embodiment. A fifth opening will be described later in a seventh embodiment. The other part of the first partition wall 37 is located outside the chamber 2b and is connected to the exhaust device 30. The gas exhaust port 38 is located between the first partition wall 37 and the exhaust device 30. The gas supply source 40 (see FIG. 2) is connected to the first gas supply port 51.

The EUV light concentrating mirror 23b has a spheroidal reflection surface. The EUV light concentrating mirror 23b is located in the first space 20a inside the chamber 2b and outside the first partition wall 37. The EUV light concentrating mirror 23b has a first focal point located in the plasma generation region 25 and a second focal point located at the intermediate focal point 292. The first opening 371 is located on the optical path of the radiation light 251 including the EUV light generated at the plasma generation region 25 and directed toward the EUV light concentrating mirror 23b. An opening 29b of the chamber 2b is located at the optical path of the reflection light 252 directed toward the intermediate focal point 292 from the EUV light concentrating mirror 23b. The EUV light concentrating mirror 23b is arranged such that the center axis of the optical path of the reflection light 252 is inclined with respect to the center axis of the optical path of the radiation light 251.

3.2 Operation

The target 27 output from the target supply unit 26 passes through the third opening 373 and reaches the plasma generation region 25. Among the plurality of targets 27, the targets 27 without being irradiated with the pulse laser light 33 and without being turned into plasma pass through the plasma generation region 25, further pass through the sixth opening 375, and reach the target collection unit 28.

The pulse laser light 33 passes through the second opening 372, enters to the inside of the first partition wall 37, and causes the target 27 to be turned into plasma by being radiated to the target 27 at the plasma generation region 25.

The radiation light 251 including the EUV light generated at the plasma generation region 25 passes through the first opening 371 and is incident on the EUV light concentrating mirror 23b. The EUV light concentrating mirror 23b concentrates the EUV light on the intermediate focal point 292 by reflecting the EUV light. The first opening 371 is located outside the optical path of the reflection light 252 including the EUV light reflected by the EUV light concentrating mirror 23b. Therefore, it is possible to suppress some of the reflection light 252 from entering the first opening 371 and being wasted. Furthermore, the first partition wall 37 is located outside the optical path of the reflection light 252. Therefore, it is possible to suppress some of the reflection light 252 from entering the first partition wall 37 and being wasted.

The gas supply source 40 (see FIG. 2) supplies the gas to the first space 20a inside the chamber 2b and outside the first partition wall 37 through the first gas supply port 51. The flow rate of the gas at the first gas supply port 51 is, for example, not less than 40 nlm and not more than 60 nlm. Here, "nlm" represents the volume of the gas flowing per minute converted to 0° C. and 1 atm.

The exhaust device 30 exhausts the gas in the second space 20b inside the first partition wall 37 to the space outside the chamber 2b and outside the first partition wall 37 through the gas exhaust port 38. As a result, the pressure in the first space 20a is maintained higher than the pressure in the second space 20b. As a result, through the first to third openings 371 to 373 and the sixth opening 375, the gas flows from the first space 20a to the second space 20b as indicated by the dashed-dotted arrows. Therefore, debris of the target substance is suppressed from moving from the second space 20b to the first space 20a, and debris of the target substance is suppressed from being deposited on the EUV light concentrating mirror 23b.

3.3 Effect (1) According to the first embodiment, the EUV light generation apparatus 1b includes the chamber 2b, the first partition wall 37, the EUV light concentrating mirror 23b, the first gas supply port 51, and the gas exhaust port 38. The first partition wall 37 covers the plasma generation region 25 in the chamber 2b and has a first opening 371. The EUV light concentrating mirror 23b is located in the first space 20a inside the chamber 2b and outside the first partition wall 37, to concentrate the EUV light generated at the plasma generation region 25 and having passed through the first opening 371. The first gas supply port 51 is formed at the chamber 2b and supplies gas to the first space 20a. The gas exhaust port 38 is formed at the first partition wall 37 and exhausts the gas in the second space 20b inside the first partition wall 37 to the space outside the first partition wall 37 and outside the chamber 2b.

Accordingly, the pressure in the first space 20a becomes higher than the pressure in the second space 20b, and the gas flows from the first space 20a to the second space 20b through the first opening 371. Therefore, debris of the target substance is suppressed from moving from the second space 20b to the first space 20a, and debris of the target substance is suppressed from being deposited on the EUV light concentrating mirror 23b.

(2) According to the first embodiment, the EUV light concentrating mirror 23b is arranged such that the first opening 371 is located outside the optical path of the reflection light 252 reflected by the EUV light concentrating mirror 23b. Accordingly, it is possible to suppress some of the reflection light 252 from entering the first opening 371 and being wasted. In other respects, the first embodiment is similar to the comparative example.

4. EUV Light Generation Apparatus 1c in which First Partition Wall 37c Includes Fourth Opening 374 for Sensor 4d

4.1 Configuration

Figure 5:
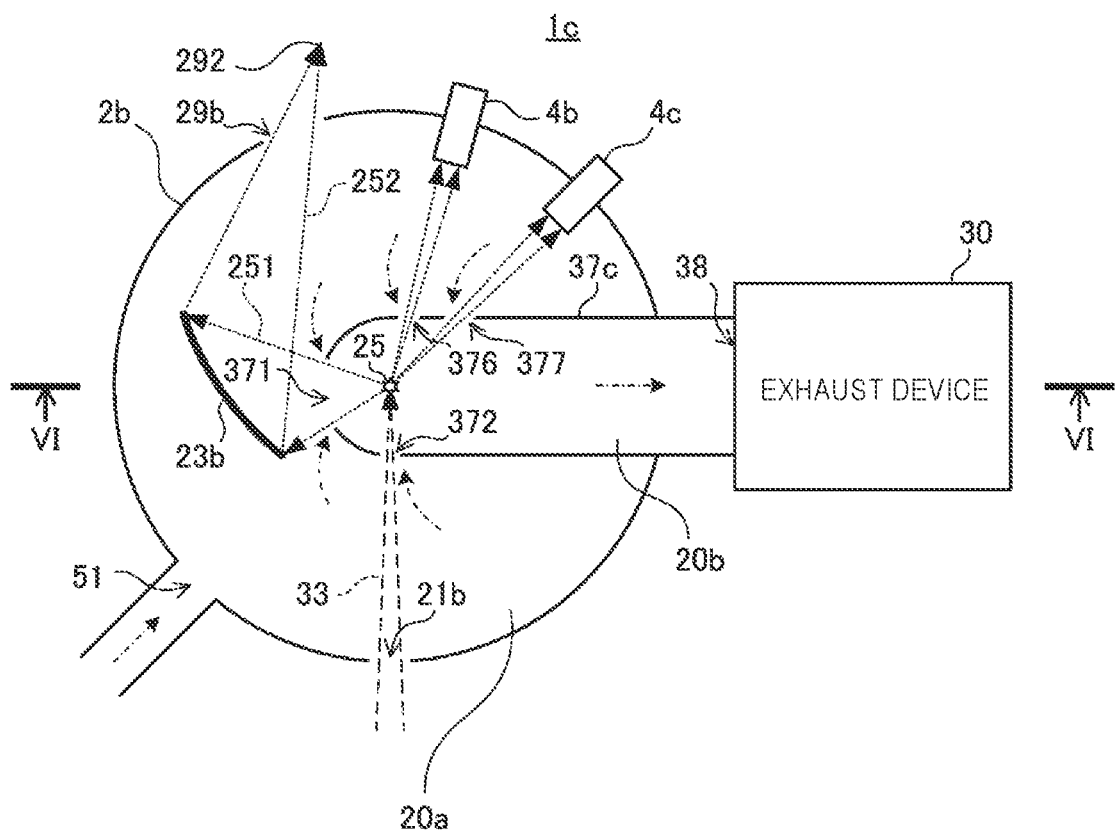
FIG. 5 is a sectional view showing the configuration of the EUV light generation apparatus according to a second embodiment.
Figure 6:
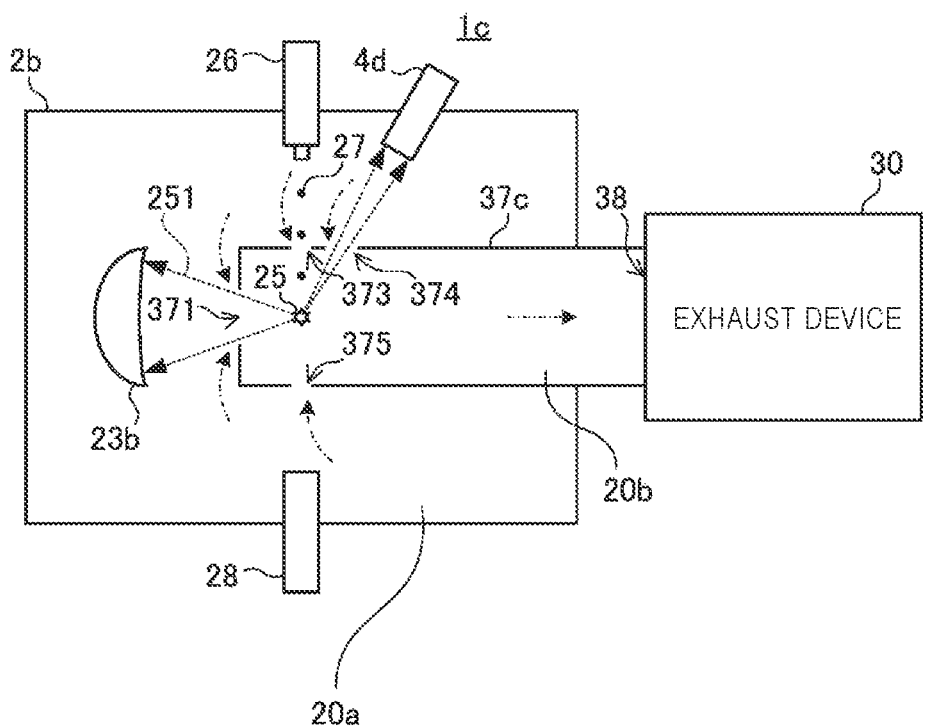
FIG. 6 is a sectional view showing the configuration of the EUV light generation apparatus according to the second embodiment.

FIGS. 5 and 6 are sectional views showing the configuration of an EUV light generation apparatus 1c according to a second embodiment. FIG. 5 shows a cross-section perpendicular to the trajectory of the target 27, and FIG. 6 shows a cross-section perpendicular to the optical path axis of the pulse laser light 33. FIG. 6 corresponds to a sectional view taken along line VI-VI of FIG. 5.

In addition to the components of the EUV light generation apparatus 1b, the EUV light generation apparatus 1c includes sensors 4b, 4c, and 4d, and includes, instead of the first partition wall 37, a first partition wall 37c having fourth openings 374, 376, and 377.

The sensors 4b, 4c and 4d are attached to the chamber 2b. The sensors 4b, 4c, and 4d may include, for example, a target sensor for detecting at least one of the presence, trajectory, position, and velocity of the target 27, or may include a sensor for detecting an emission point of the EUV light. Although not shown, each of the sensors 4b, 4c, and 4d may include an image sensor or an optical sensor, and an optical system that forms an image at the plasma generation region 25 inside the first partition wall 37c or the vicinity thereof on the image sensor or the optical sensor. Instead of the sensor, a light source that illuminates the plasma generation region 25 with visible light may be arranged at any one position of the sensors 4b, 4c, and 4d.

The fourth openings 374, 376, and 377 are located between the plasma generation region 25 and the sensors 4b, 4c, and 4d, respectively. Accordingly, light emitted from the plasma generation region 25 or the vicinity thereof reaches the image sensor or the optical sensor. Alternatively, light emitted from a light source located at any one of the positions of the sensors 4b, 4c, and 4d reaches the plasma generation region 25. Thus, the fourth openings 374, 376, and 377 allow light for observing a part of the second space 20b to pass therethrough.

4.2 Operation and Effect

Similarly to the first to third openings 371 to 373 and the sixth opening 375, the gas flows from the first space 20a toward the second space 20b through the fourth openings 374, 376, and 377. Therefore, debris of the target substance is suppressed from moving from the second space 20b to the first space 20a, and debris of the target substance is suppressed from being deposited on the EUV light concentrating mirror 23b. In other respects, the second embodiment is similar to the first embodiment.

5. EUV Light Generation Apparatus 1d Including Second Partition Wall 2d

5.1 Configuration

Figure 7:
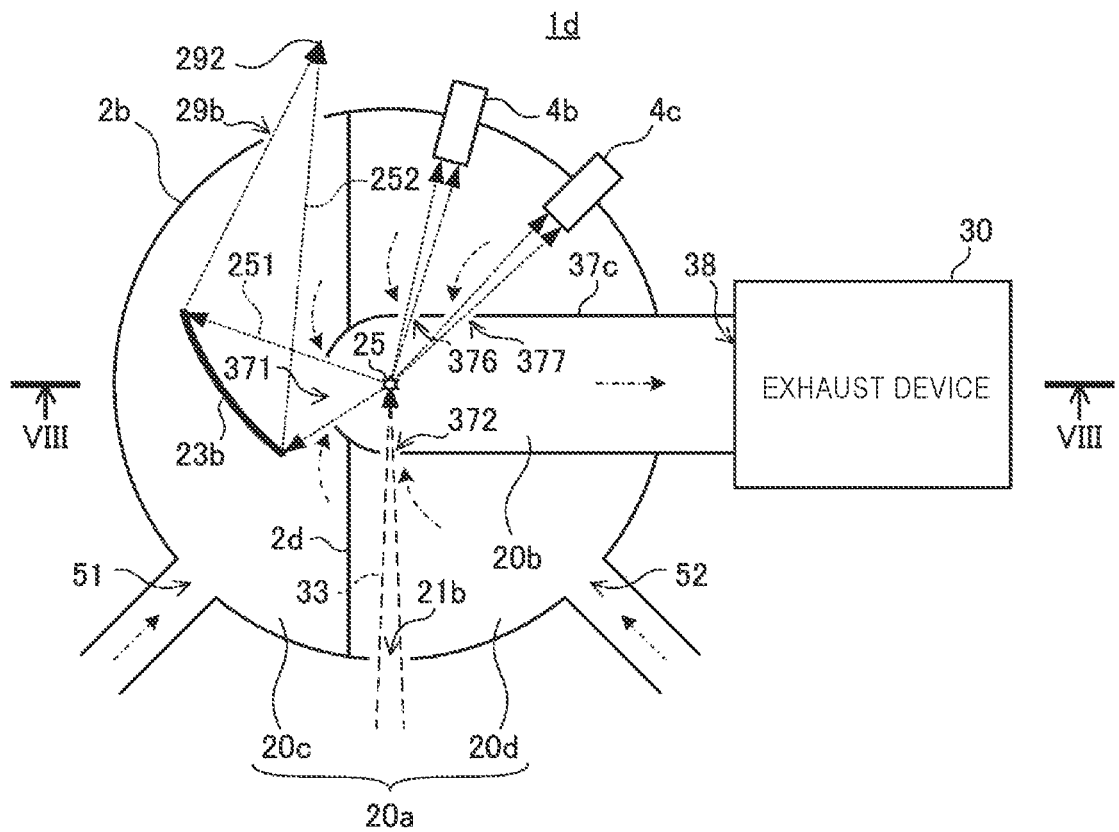
FIG. 7 is a sectional view showing the configuration of the EUV light generation apparatus according to a third embodiment.
Figure 8:
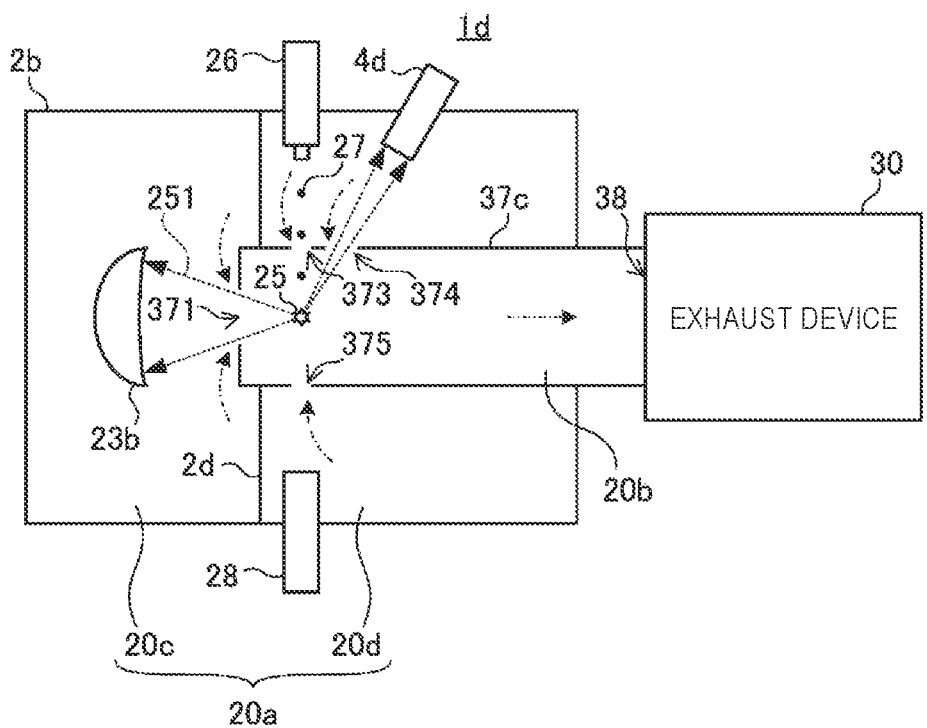
FIG. 8 is a sectional view showing the configuration of the EUV light generation apparatus according to the third embodiment.

FIGS. 7 and 8 are sectional views showing the configuration of an EUV light generation apparatus 1d according to a third embodiment. FIG. 7 shows a cross-section perpendicular to the trajectory of the target 27, and FIG. 8 shows a cross-section perpendicular to the optical path axis of the pulse laser light 33. FIG. 8 corresponds to a sectional view taken along line VIII-VIII of FIG. 7.

In addition to the components of the EUV light generation apparatus 1c, the EUV light generation apparatus 1d includes a second partition wall 2d and a second gas supply port 52. The second partition wall 2d separates the first space 20a in the chamber 2b into a third space 20c and a fourth space 20d. The first opening 371 is configured to provide communication between the third space 20c and the second space 20b. The second opening 372, the third opening 373, the fourth openings 374, 376, 377, and the sixth opening 375 are configured to provide communication between the fourth space 20d and the second space 20b.

5.2 Operation

The gas supply source 40 (see FIG. 2) supplies the gas to the third space 20c through the first gas supply port 51. The gas supply source 40 supplies the gas to the fourth space 20d through the second gas supply port 52. The flow rate of the gas supplied through the first gas supply port 51 and the flow rate of the gas supplied through the second gas supply port 52 are individually controlled by a control unit such as the processor 5.

The gas supplied to the third space 20c fills the third space 20c, and then flows into the second space 20b through the first opening 371. The gas supplied to the fourth space 20d fills the fourth space 20d, and then flows into the second space 20b through the second opening 372, the third opening 373, the fourth openings 374, 376, and 377, and the sixth opening 375.

5.3 Effect (3) For example, in the case where a plurality of openings including the first and second openings 371 and 372 are formed in the first partition wall 37c as in the second embodiment, if the pressure difference between the inside and the outside of the first partition wall 37c in the vicinity of the first opening 371 is substantially the same as that in the vicinity of the second opening 372, the flow velocity of the gas at the first opening 371 may not be the same as that at the second opening 372. For example, when the area of the second opening 372 is smaller than that of the first opening 371, it is considered that the flow velocity of the gas at the second opening 372 is lower than that at the first opening 371. In this case, there is a possibility that debris of the target substance leaks out in the direction opposite to the gas flow in the second opening 372. In order to increase the flow velocity of the gas in the second opening 372, it may be required to supply a large amount of the gas to the first space 20a.

According to the third embodiment, the EUV light generation apparatus 1d further includes the second partition wall 2d that separates the first space 20a into the third space 20c and the fourth space 20d, and the second gas supply port 52 that is formed in the chamber 2b and supplies the gas to the fourth space 20d. The first gas supply port 51 is configured to supply the gas to the third space 20c. The first partition wall 37c has the second opening 372. The first opening 371 provides communication between the third space 20c and the second space 20b, and the second opening 372 provides communication between the fourth space 20d and the second space 20b.

As described above, in the third embodiment, the third space 20c communicating with the second space 20b through the first opening 371 and the fourth space 20d communicating with the second space 20b through the second opening 372 are separated by the second partition wall 2d. Then, the gas is individually supplied to the third space 20c and the fourth space 20d. Accordingly, the gas amounts supplied from the first and second gas supply ports 51 and 52 can be individually controlled so that movement of debris of the target substance is suppressed in each of the first opening 371 and the second opening 372. Therefore, the gas consumption amount can be reduced.

(4) According to the third embodiment, the second opening 372 allows the pulse laser light 33 to pass therethrough so as to be incident on the plasma generation region 25. The area of the second opening 372 through which the pulse laser light 33 passes is smaller than the area of the first opening 371. By individually controlling the gas supply amounts from the first and second gas supply ports 51 and 52 so as to suppress the movement of debris of the target substance, the gas consumption amount can be reduced.

(5) According to the third embodiment, the EUV light generation apparatus 1d further includes the target supply unit 26 that supplies the target 27 to the plasma generation region 25. The first partition wall 37c has the third opening 373, and the third opening 373 provides communication between the fourth space 20d and the second space 20b and allows the target 27 to pass therethrough. The area of the third opening 373 through which the target 27 passes is smaller than the area of the first opening 371. By individually controlling the gas supply amounts from the first and second gas supply ports 51 and 52 so as to suppress the movement of debris of the target substance, the gas consumption amount can be reduced.

(6) According to the third embodiment, the first partition wall 37c has the fourth openings 374, 376, and 377, and the fourth openings 374, 376, and 377 provide communication between the fourth space 20d and the second space 20b and allow light for observing a part of the second space 20b to pass therethrough. Each area of the fourth openings 374, 376, and 377 through which the light for observing a part of the second space 20b passes is smaller than the area of the first opening 371. By individually controlling the gas supply amounts from the first and second gas supply ports 51 and 52 so as to suppress the movement of debris of the target substance, the gas consumption amount can be reduced.

In other respects, the third embodiment is similar to the second embodiment. Alternatively, similarly to the first embodiment, the third embodiment may not include the sensors 4b, 4c, and 4d and the fourth openings 374, 376, and 377.

6. EUV Light Generation Apparatus 1e in which First Partition Wall 37e Includes Heater

6.1 Configuration

Figure 9:
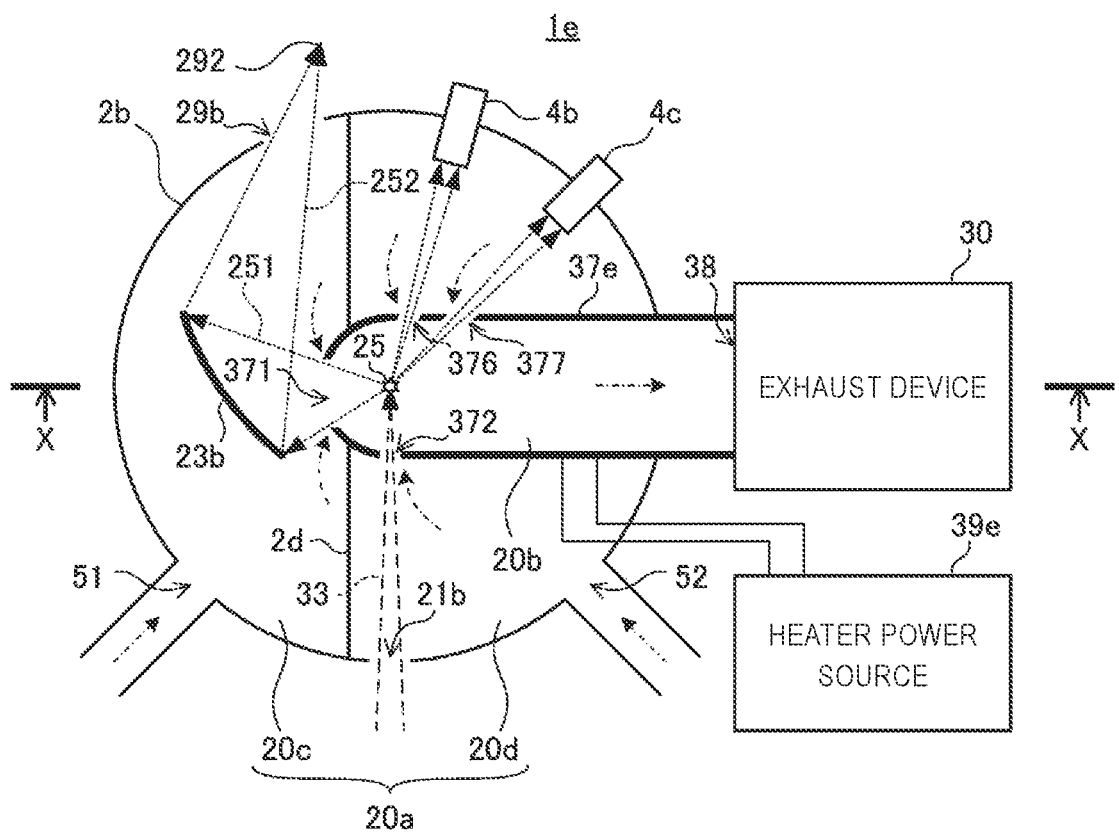
FIG. 9 is a sectional view showing the configuration of the EUV light generation apparatus according to a fourth embodiment.
Figure 10:
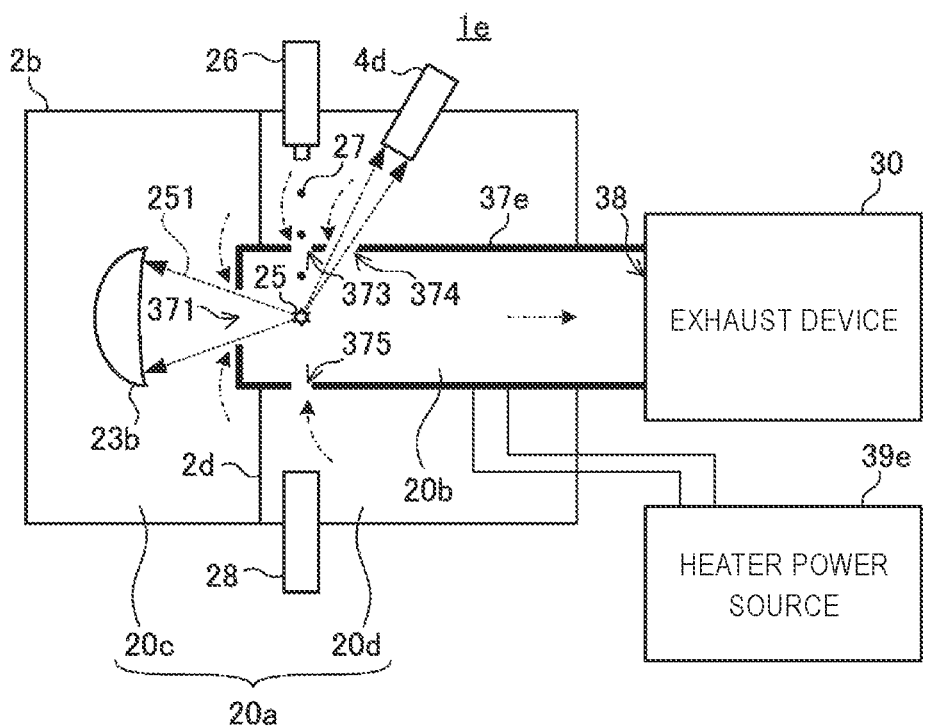
FIG. 10 is a sectional view showing the configuration of the EUV light generation apparatus according to the fourth embodiment.

FIGS. 9 and 10 are sectional views showing the configuration of an EUV light generation apparatus 1e according to a fourth embodiment. FIG. 9 shows a cross-section perpendicular to the trajectory of the target 27, and FIG. 10 shows a cross-section perpendicular to the optical path axis of the pulse laser light 33. FIG. 10 corresponds to a sectional view taken along line X-X of FIG. 9.

In the EUV light generation apparatus 1e, a first partition wall 37e including a heater is arranged instead of the first partition wall 37c in the third embodiment. The heater included in the first partition wall 37e is connected to a heater power source 39e.

6.2 Operation

When the heater power source 39e supplies current to the heater, the first partition wall 37e is heated. The first partition wall 37e is heated, for example, to 250° C. which is a temperature equal to or higher than the melting point of tin constituting the target substance. Thus, debris of the target substance adhering to the inner surface of the first partition wall 37e is melted, and can be collected by a collector (not shown).

6.3 Other Configuration Examples

In the fourth embodiment, the first partition wall 37e is heated by the heater, but the present disclosure is not limited thereto. The first partition wall 37e may include a cooling mechanism as long as debris of the target substance adhering to the inner surface of the first partition wall 37e can be etched by cooling the first partition wall 37e. That is, the EUV light generation apparatus 1e may include a temperature adjustment device that performs one or both of heating and cooling of the first partition wall 37e.

In the present disclosure, not limited to the case where the temperature of the first partition wall 37e is adjusted, adhesion of debris of the target substance may be suppressed by forming coating on the inner surface of the first partition wall 37e. As the material of the coating, titanium nitride (TiN), titanium oxide ($TiO_2$), chromium nitride (CrN), or chromium oxide ($CrO_2$) is preferable.

6.4 Effect (7) According to the fourth embodiment, the EUV light generation apparatus 1e includes the heater for adjusting the temperature of the first partition wall 37e and the heater power source 39e. Accordingly, debris of the target substance adhering to the surface of the first partition wall 37e is melted, and the debris can be collected by the collector (not shown).

(8) In the fourth embodiment, the EUV light generation apparatus 1e may have coating formed on the surface of the first partition wall 37e to suppress the target substance from adhering thereto. Accordingly, debris of the target substance is suppressed from adhering to the surface of the first partition wall 37e.

In other respects, the fourth embodiment is similar to the third embodiment. Alternatively, similarly to the second embodiment, the fourth embodiment may not include the second partition wall 2d. Alternatively, similarly to the first embodiment, the fourth embodiment may not include the sensors 4b, 4c, and 4d.

7. EUV Light Generation Apparatus 1f in which Moving Direction of Target 27 and Gas is Gravity Direction

7.1 Configuration

Figure 11:
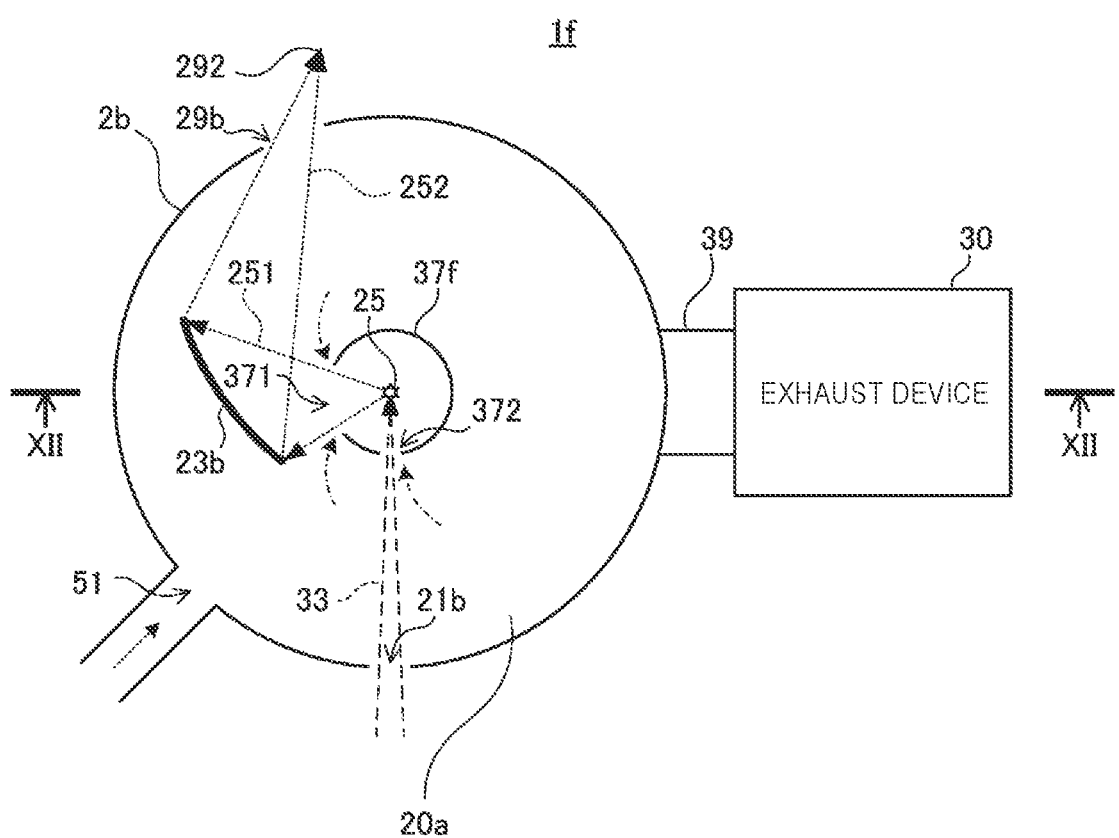
FIG. 11 is a sectional view showing the configuration of the EUV light generation apparatus according to a fifth embodiment.
Figure 12:
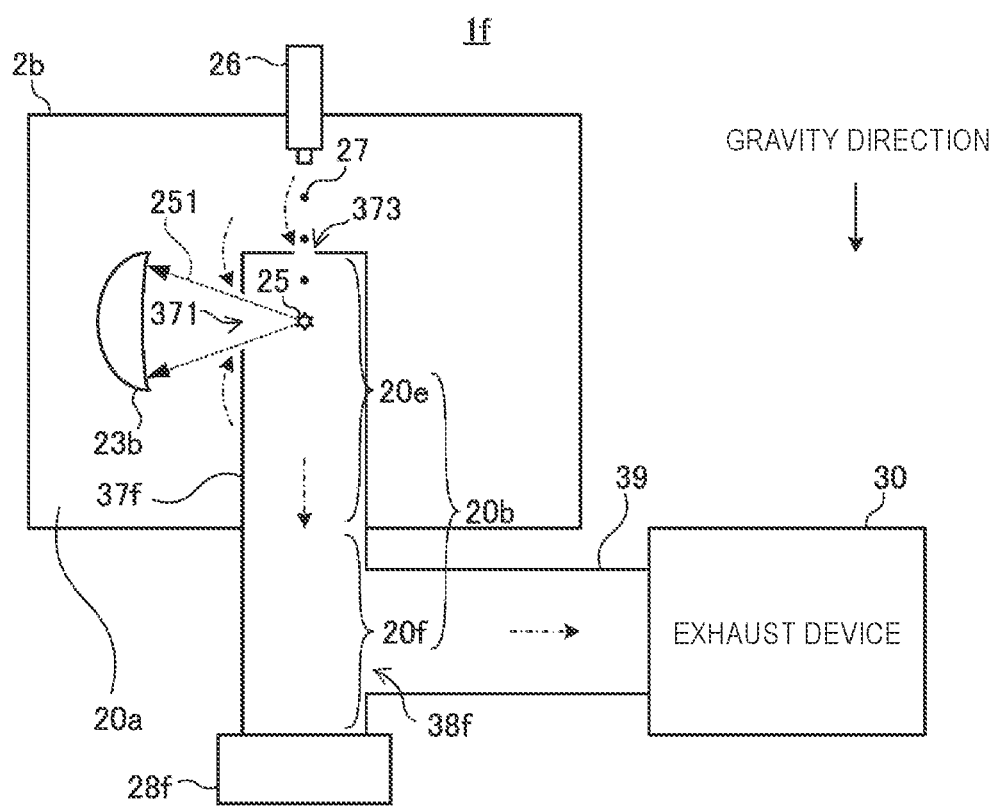
FIG. 12 is a sectional view showing the configuration of the EUV light generation apparatus according to the fifth embodiment.

FIGS. 11 and 12 are sectional views showing the configuration of an EUV light generation apparatus 1f according to a fifth embodiment. FIG. 11 shows a cross-section perpendicular to the trajectory of the target 27, and FIG. 12 shows a cross-section perpendicular to the optical path axis of the pulse laser light 33. FIG. 12 corresponds to a sectional view taken along line XII-XII of FIG. 11.

In the EUV light generation apparatus 1f, a cylindrical first partition wall 37f, the center axis direction of which coinciding with the gravity direction, is arranged instead of the first partition wall 37 in the first embodiment. It is desirable that the center axis of the first partition wall 37f coincides with the trajectory of the target 27. The first partition wall 37f penetrates the bottom surface of the chamber 2b. The second space 20b inside the first partition wall 37f includes a fifth space 20e inside the chamber 2b and a sixth space 20f outside the chamber 2b.

Outside the chamber 2b, a target collection unit 28f is arranged at the lower end of the first partition wall 37f. Between the chamber 2b and the target collection unit 28f, a gas exhaust port 38f is formed in the first partition wall 37f, and the exhaust device 30 is connected to the gas exhaust port 38f through an exhaust pipe 39.

7.2 Operation

Among the plurality of targets 27, the targets 27 without being irradiated with the pulse laser light 33 and without being turned into plasma move from the fifth space 20e to the sixth space 20f and reach the target collection unit 28f.

The gas supply source 40 (see FIG. 2) supplies the gas to the first space 20a through the first gas supply port 51. The exhaust device 30 exhausts the gas in the fifth and sixth spaces 20e and 20f inside the first partition wall 37f. Accordingly, the pressure in the first space 20a becomes higher than that in the fifth and sixth spaces 20e and 20f. As a result, the gas is guided from the first space 20a to the fifth space 20e, further from the fifth space 20e to the sixth space 20f in the gravity direction, and further from the sixth space 20f to the exhaust pipe 39 in the direction intersecting the gravity direction, and flows to the exhaust device 30.

7.3 Effect (9) According to the fifth embodiment, the EUV light generation apparatus 1f further includes the target supply unit 26 that supplies the target 27 to the plasma generation region 25, and the target collection unit 28f that is arranged on the first partition wall 37f and collects the target 27 having passed through the plasma generation region 25. Accordingly, since the target collection unit 28f that collects the target 27 having passed through the plasma generation region 25 is arranged on the first partition wall 37f, the target collection unit 28f can also collect debris of the target substance having not been exhausted from the first partition wall 37f.

(10) According to the fifth embodiment, the first partition wall 37f is configured such that the gas in the fifth space 20e, being a part of the second space 20b, inside the chamber 2b passes through the sixth space 20f, being another part of the second space 20b, outside the chamber 2b, and is exhausted to the outside of the first partition wall 37f. Then, the movement direction of the gas from the fifth space 20e to the sixth space 20f coincides with the gravity direction. When debris of the target substance adheres to the inner surface of the first partition wall 37f and deposits thickly, the debris may fall off from the inner surface of the first partition wall 37f. According to the fifth embodiment, such debris falls from the fifth space 20e inside the chamber 2b toward the sixth space 20f outside the chamber 2b, so that the debris can be collected outside the chamber 2b.

(11) According to the fifth embodiment, the EUV light generation apparatus 1f further includes the exhaust pipe 39 connected to the gas exhaust port 38f and configured to guide the gas in the sixth space 20f in the direction intersecting the gravity direction to exhaust the gas. Accordingly, since the gas in the sixth space 20f is guided in the direction intersecting the gravity direction and exhausted, it is possible to suppress debris fallen off from the inner surface of the first partition wall 37f from entering the exhaust pipe 39.

In other respects, the fifth embodiment is similar to the first embodiment. Alternatively, similarly to the second embodiment, the fifth embodiment may include the sensors 4b, 4c, and 4d. Alternatively, similarly to the third embodiment, the fifth embodiment may include the second partition wall 2d. Alternatively, similarly to the fourth embodiment, the fifth embodiment may include the temperature adjustment device for performing either or both of heating and cooling of the first partition wall 37f, or may have coating formed on the inner surface of the first partition wall 37f.

8. EUV Light Generation Apparatus 1g in which First Partition Wall 37g Includes Flange 37h

8.1 Configuration and Operation

Figure 13:
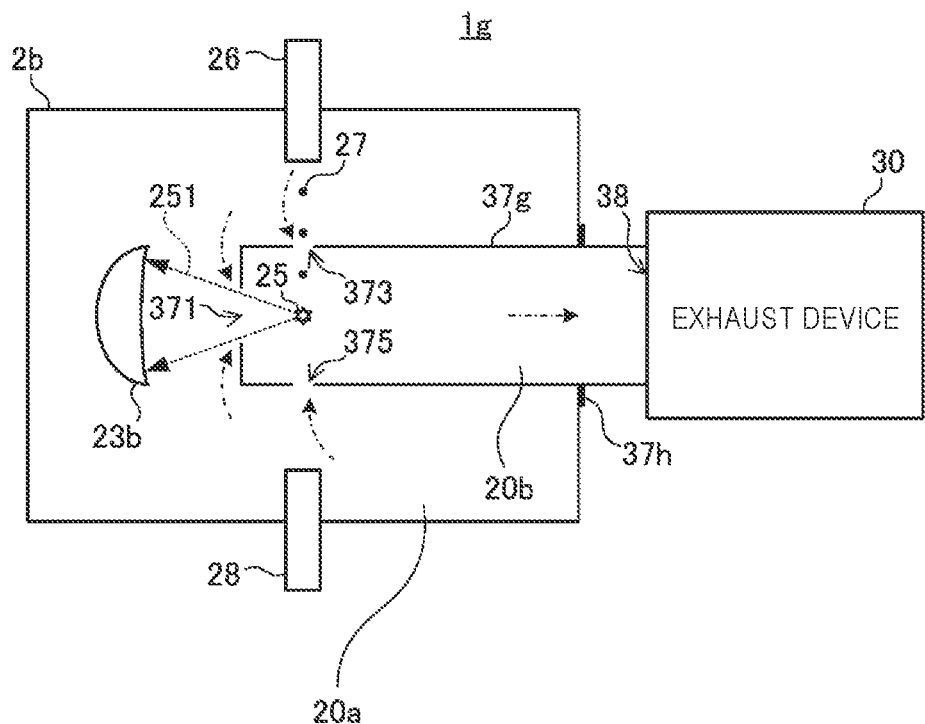
FIG. 13 is a sectional view showing the configuration of the EUV light generation apparatus according to a sixth embodiment.

FIG. 13 is a sectional view showing the configuration of the EUV light generation apparatus 1g according to a sixth embodiment. FIG. 13 shows a cross section perpendicular to the optical path axis of the pulse laser light 33 (see FIG. 3).

In the EUV light generation apparatus 1g, a first partition wall 37g is arranged instead of the first partition wall 37 in the first embodiment. A flange 37h is formed around the first partition wall 37g.

Figure 14:
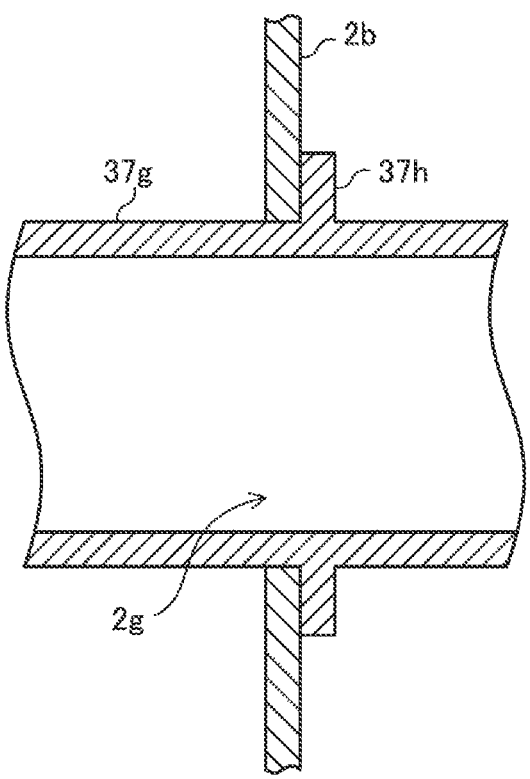
FIG. 14 is an enlarged sectional view showing a flange and components therearound.

FIG. 14 is an enlarged sectional view showing the flange 37h and components therearound. A through hole 2g through which the first partition wall 37g penetrates is formed in a wall of the chamber 2b. A part of the first partition wall 37g is inserted into the through hole 2g from the right side in FIGS. 13 and 14, and the flange 37h is fixed to the wall of the chamber 2b by bolts (not shown). When debris has adhered to the first partition wall 37g, the bolts can be removed to replace the first partition wall 37g.

8.2 Effect

(12) According to the sixth embodiment, the first partition wall 37g penetrates the wall of the chamber 2b, and the flange 37h fixed to the wall of the chamber 2b from the outside of the chamber 2b is arranged around the first partition wall 37g. Accordingly, the first partition wall 37g can be fixed to and removed from the chamber 2b, thereby facilitating maintenance.

In other respects, the sixth embodiment is similar to the first embodiment. Alternatively, similarly to the second embodiment, the sixth embodiment may include the sensors 4b, 4c, and 4d. Alternatively, similarly to the third embodiment, the sixth embodiment may include the second partition wall 2d. Alternatively, similarly to the fourth embodiment, the sixth embodiment may include the temperature adjustment device for performing either or both of heating and cooling of the first partition wall 37g, or may have coating formed on the inner surface of the first partition wall 37g. Alternatively, similarly to the fifth embodiment, in the sixth embodiment, the first partition wall 37g may be arranged vertically.

9. EUV Light Generation Apparatus 1h in which First Partition Wall 37i Includes Flange 37h

9.1 Configuration and Operation

Figure 15:
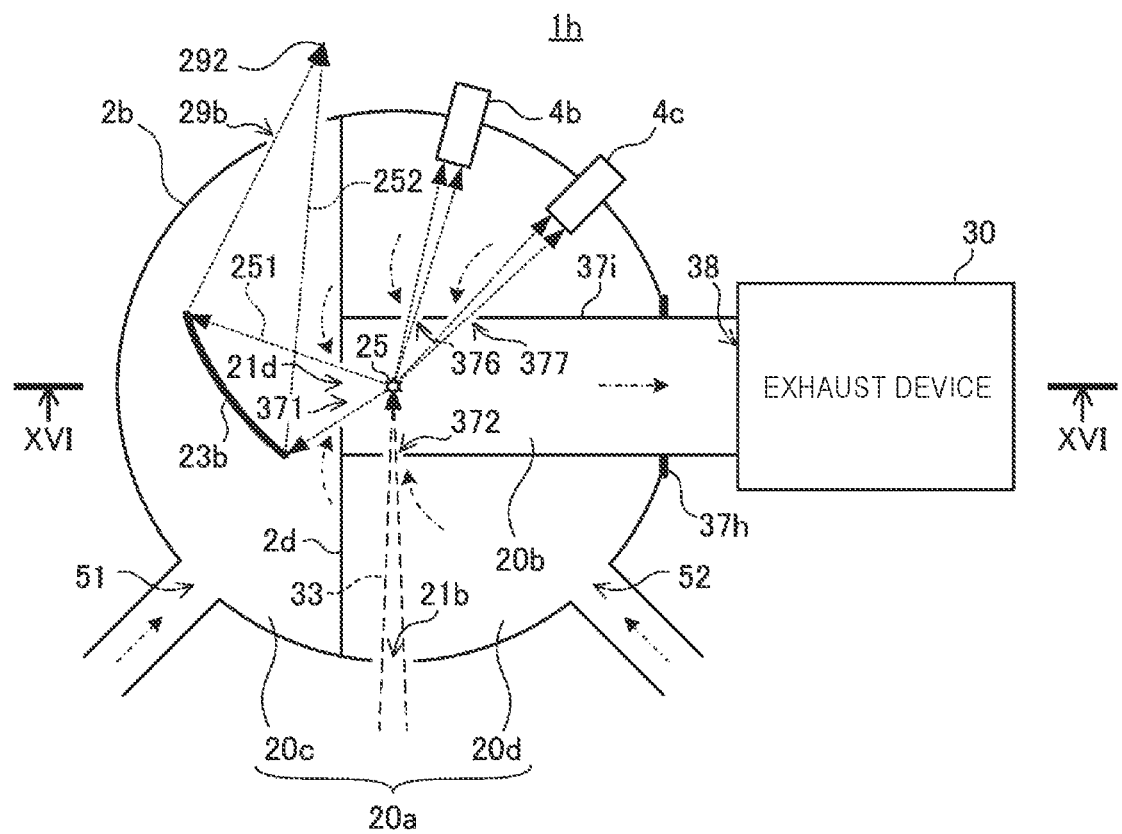
FIG. 15 is a sectional view showing the configuration of the EUV light generation apparatus according to a seventh embodiment.
Figure 16:
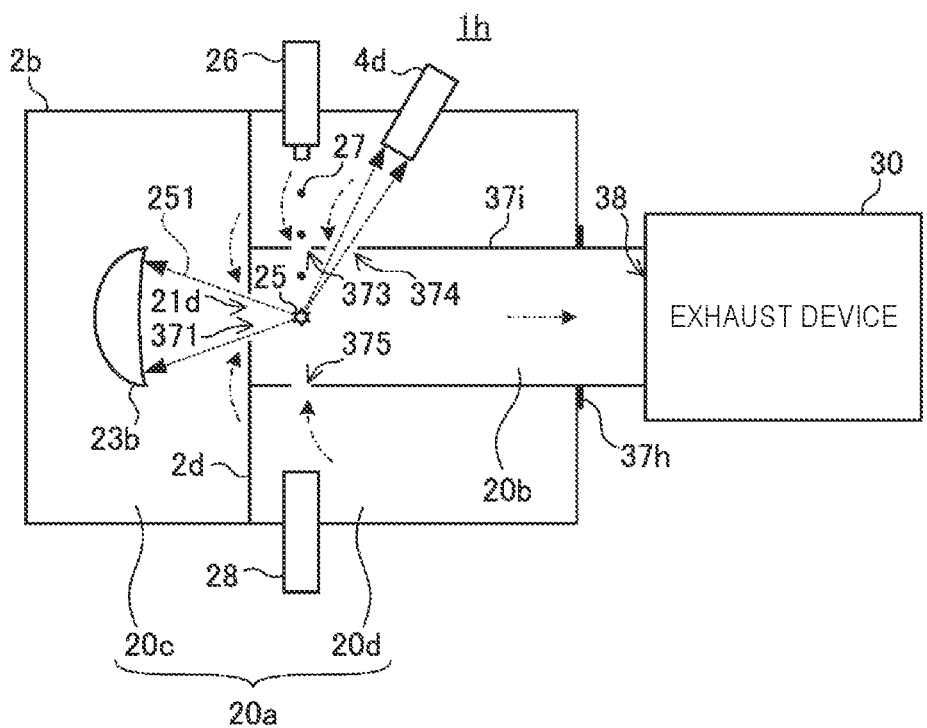
FIG. 16 is a sectional view showing the configuration of the EUV light generation apparatus according to the seventh embodiment.

FIGS. 15 and 16 are sectional views showing the configuration of an EUV light generation apparatus 1h according to a seventh embodiment. FIG. 15 shows a cross-section perpendicular to the trajectory of the target 27, and FIG. 16 shows a cross-section perpendicular to the optical path axis of the pulse laser light 33. FIG. 16 corresponds to a sectional view taken along line XVI-XVI of FIG. 15.

In the EUV light generation apparatus 1h, a first partition wall 37i is arranged instead of the first partition wall 37c in the third embodiment described with reference to FIGS. 7 and 8. The flange 37h is formed around the first partition wall 37i. The configuration of the flange 37h is similar to the corresponding configuration in the sixth embodiment described with reference to FIGS. 13 and 14.

Similarly to the sixth embodiment, the flange 37h is fixed to the wall of the chamber 2b by bolts (not shown). When debris has adhered to the first partition wall 37i, the first partition wall 37i can be replaced by removing the bolts.

In the seventh embodiment, the second partition wall 2d separates the first space 20a into the third space 20c and the fourth space 20d. The second partition wall 2d has a fifth opening 21d. As will be described with reference to FIGS. 17 and 18, the first partition wall 37i around the first opening 371 and the second partition wall 2d around the fifth opening 21d are close to each other and may not be directly fixed to each other. That is, bolting, welding, bonding, or the like may not be performed for fixing the first partition wall 37i around the first opening 371 and the second partition wall 2d around the fifth opening 21d.

9.2 First Example

Figure 17:
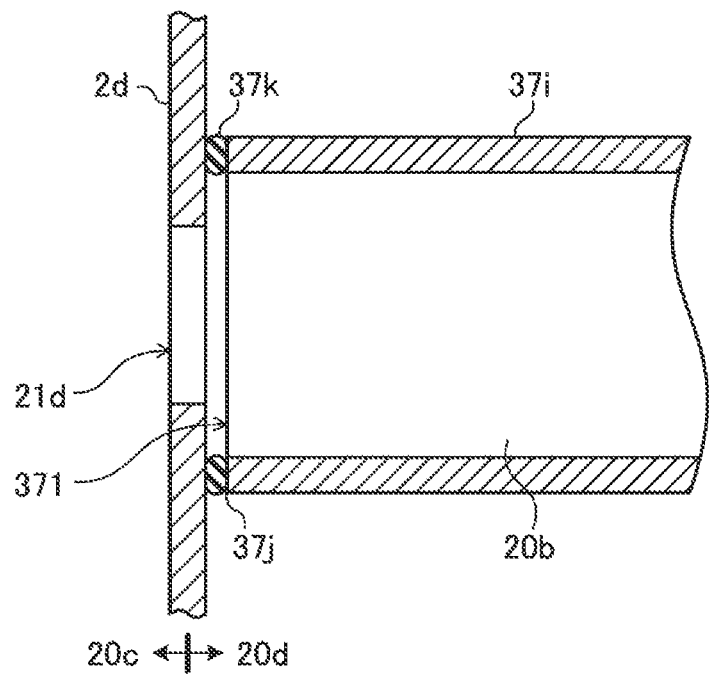
FIG. 17 is a sectional view showing a first example of arrangement of a first partition wall with respect to a second partition wall in the seventh embodiment.

FIG. 17 is a sectional view showing a first example of arrangement of the first partition wall 37i with respect to the second partition wall 2d in the seventh embodiment. An end part 37j of the first partition wall 37i and the surface of the second partition wall 2d on the fourth space 20d side face each other. An elastomer member 37k is arranged between the end part 37j of the first partition wall 37i and the surface of the second partition wall 2d on the fourth space 20d side. The elastomer member 37k corresponds to the elastic body in the present disclosure. The elastomer member 37k is arranged as being sandwiched between the first partition wall 37i around the first opening 371 and the second partition wall 2d around the fifth opening 21d.

The elastomer member 37k has an annular shape. The diameter of the annular elastomer member 37k is substantially the same as the diameter of the cylindrical first partition wall 37i. The elastomer member 37k provides gas sealing between the first partition wall 37i around the first opening 371 and the second partition wall 2d around the fifth opening 21d.

The elastomer member 37k is fixed, for example, to the first partition wall 37i, and pressed against the second partition wall 2d without being fixed thereto. Alternatively, the elastomer member 37k may be fixed to the second partition wall 2d and pressed against the first partition wall 37i without being fixed thereto. In this manner, the end part 37j of the first partition wall 37i and the surface of the second partition wall 2d on the fourth space 20d side are not fixed to each other.

9.3 Second Example

Figure 18:
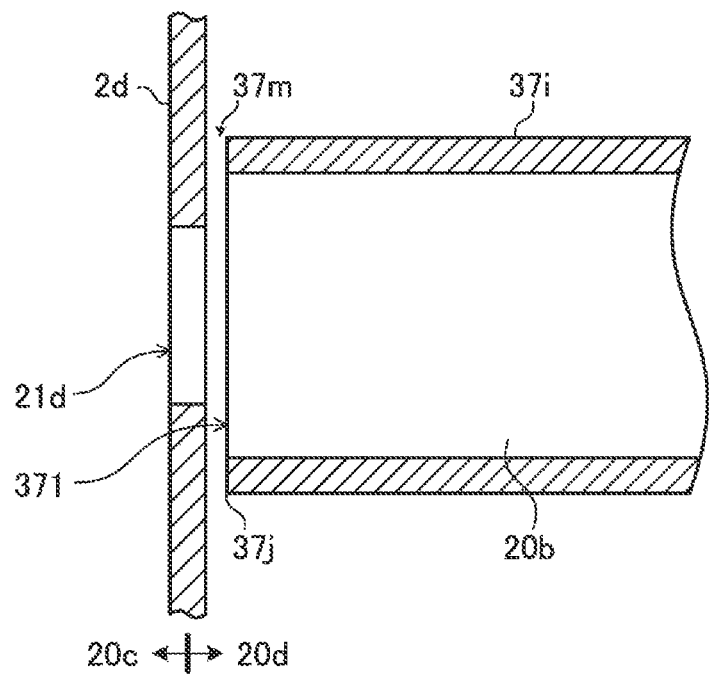
FIG. 18 is a sectional view showing a second example of arrangement of the first partition wall with respect to the second partition wall in the seventh embodiment.

FIG. 18 is a sectional view showing a second example of arrangement of the first partition wall 37i with respect to the second partition wall 2d in the seventh embodiment. The end part 37j of the first partition wall 37i and the surface of the second partition wall 2d on the fourth space 20d side are separated apart from each other. It is desirable that a gap 37m between the first partition wall 37i and the second partition wall 2d is as narrow as possible to suppress leakage of debris of the target substance from the second space 20b. The gap 37m is preferably 5 mm or less, and more preferably 2 mm or less.

9.4 Effect

(13) According to the seventh embodiment, the EUV light generation apparatus 1h includes the second partition wall 2d. The second partition wall 2d separates the first space 20a into the third space 20c in which the EUV light concentrating mirror 23b is located and the fourth space 20d in contact with the first partition wall 37i. The second partition wall 2d has the fifth opening 21d through which the EUV light generated in the plasma generation region 25 passes toward the EUV light concentrating mirror 23b. The first partition wall 37i around the first opening 371 and the second partition wall 2d around the fifth opening 21d are close to each other. Accordingly, the first partition wall 37i can be fixed to and removed from the chamber 2b even in the configuration including the second partition wall 2d, thereby facilitating maintenance.

(14) According to the seventh embodiment, the end part 37j of the first partition wall 37i and the surface of the second partition wall 2d on the fourth space 20d side face each other. Accordingly, by inserting the first partition wall 37i from the outside of the chamber 2b toward the surface of the second partition wall 2d on the fourth space 20d side, the first partition wall 37i can be placed at a predetermined position.

(15) According to the seventh embodiment, the EUV light generation apparatus 1h includes the elastomer member 37k sandwiched between the first partition wall 37i around the first opening 371 and the second partition wall 2d around the fifth opening 21d. Accordingly, it is possible to suppress debris of the target substance in the second space 20b from leaking from between the first partition wall 37i around the first opening 371 and the second partition wall 2d around the fifth opening 21d.

(16) According to the seventh embodiment, the elastomer member 37k provides gas sealing between the first partition wall 37i around the first opening 371 and the second partition wall 2d around the fifth opening 21d. Accordingly, it is possible to further suppress debris of the target substance in the second space 20b from leaking from between the first partition wall 37i around the first opening 371 and the second partition wall 2d around the fifth opening 21d.

(17) According to the seventh embodiment, the elastomer member 37k is fixed to one of the first partition wall 37i and the second partition wall 2d and is pressed against the other thereof. Accordingly, the elastomer member 37k is suppressed from being displaced from the position between the first partition wall 37i and the second partition wall 2d.

(18) According to the seventh embodiment, the first partition wall 37i around the first opening 371 and the second partition wall 2d around the fifth opening 21d are separated apart from each other. Accordingly, even when the first partition wall 37i is thermally expanded, the first partition wall 37i is suppressed from pressing the second partition wall 2d to deform the second partition wall 2d.

In other respects, the seventh embodiment is similar to the third embodiment. Alternatively, similarly to the first embodiment, the seventh embodiment may not include the sensors 4b, 4c, and 4d. Alternatively, similarly to the fourth embodiment, the seventh embodiment may include the temperature adjustment device for performing either or both of heating and cooling of the first partition wall 37i, or may have coating formed on the inner surface of the first partition wall 37i. Alternatively, similarly to the fifth embodiment, in the seventh embodiment, the first partition wall 37i may be arranged vertically.

10. Others

Figure 19:
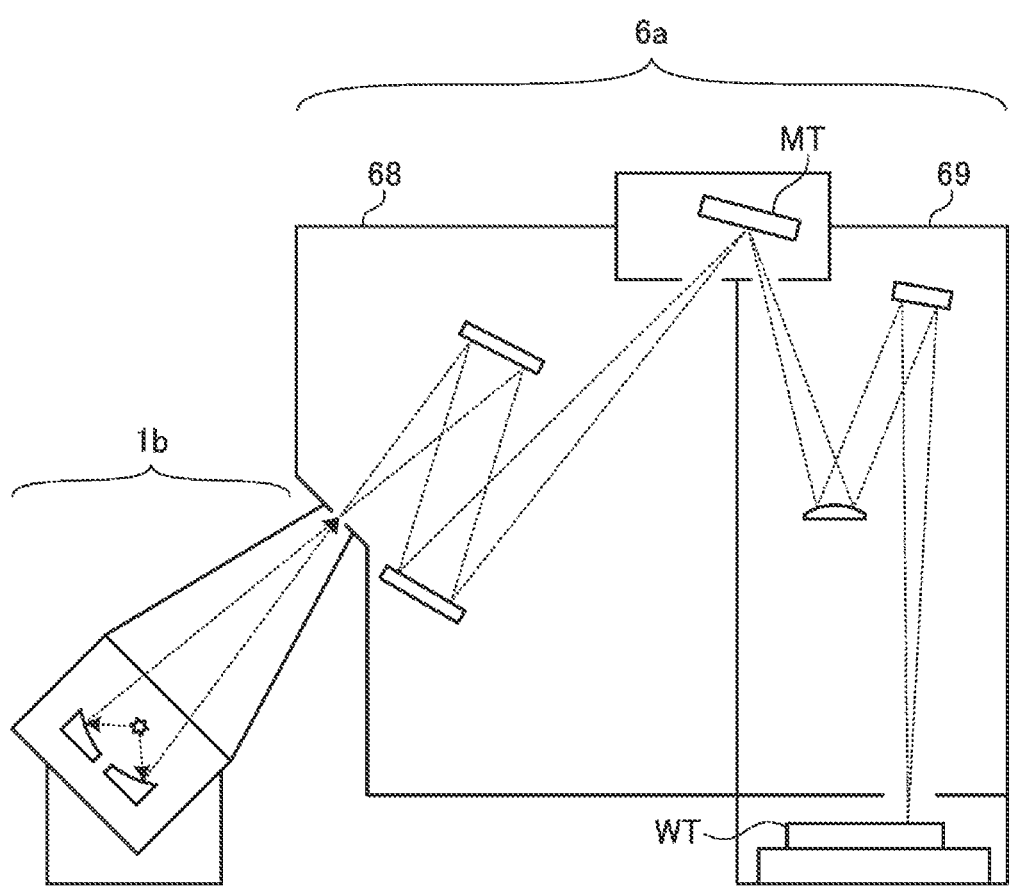
FIG. 19 schematically shows the configuration of an exposure apparatus connected to the EUV light generation apparatus.

FIG. 19 schematically shows the configuration of an exposure apparatus 6a connected to the EUV light generation apparatus 1b. In FIG. 19, the exposure apparatus 6a as the external apparatus 6 (see FIG. 1) includes a mask irradiation unit 68 and a workpiece irradiation unit 69. The mask irradiation unit 68 illuminates, via a reflection optical system, a mask pattern of the mask table MT with the EUV light incident from the EUV light generation apparatus 1b. The workpiece irradiation unit 69 images the EUV light reflected by the mask table MT onto a workpiece (not shown) arranged on the workpiece table WT via the reflection optical system. The workpiece is a photosensitive substrate such as a semiconductor wafer on which photoresist is applied. The exposure apparatus 6a synchronously translates the mask table MT and the workpiece table WT to expose the workpiece to the EUV light reflecting the mask pattern. Through the exposure process as described above, a device pattern is transferred onto the semiconductor wafer, thereby an electronic device can be manufactured. Instead of the EUV light generation apparatus 1b, any one of the EUV light generation apparatuses 1c, 1d, 1e, 1f, 1g, and 1h may be used.

Figure 20:
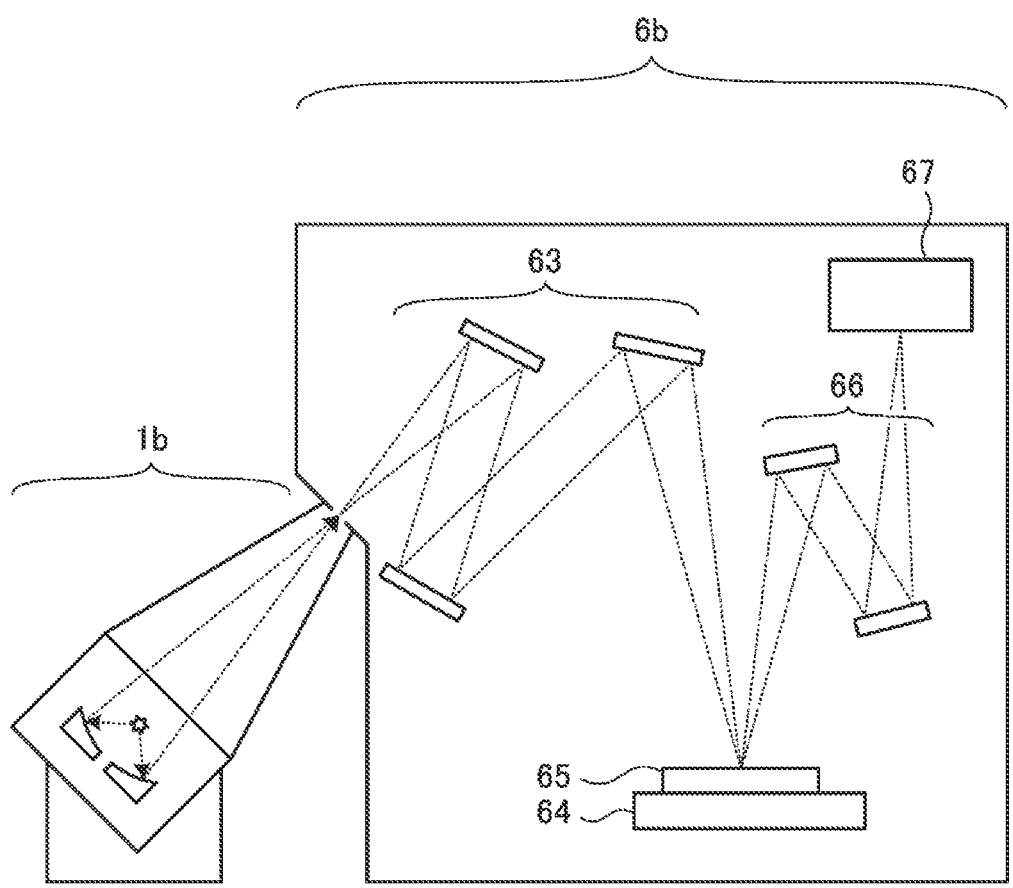
FIG. 20 schematically shows the configuration of an inspection device connected to the EUV light generation apparatus.

FIG. 20 schematically shows the configuration of an inspection device 6b connected to the EUV light generation apparatus 1b. In FIG. 20, the inspection device 6b as the external apparatus 6 (see FIG. 1) includes an illumination optical system 63 and a detection optical system 66. The Illumination optical system 63 reflects the EUV light incident from the EUV light generation apparatus 1b to illuminate the mask 65 placed on a mask stage 64. Here, the mask 65 conceptually includes a mask blank before a pattern is formed. The detection optical system 66 reflects the EUV light from the illuminated mask 65 and forms an image on a light receiving surface of a detector 67. The detector 67 having received the EUV light obtains an image of the mask 65. The detector 67 is, for example, a time delay integration (TDI) camera. Defects of the mask 65 are inspected based on the image of the mask 65 obtained by the above-described process, and a mask suitable for manufacturing an electronic device is selected using the inspection result. Then, the pattern formed on the selected mask is exposed and transferred onto the photosensitive substrate using the exposure apparatus 6a. Instead of the EUV light generation apparatus 1b, any one of the EUV light generation apparatuses 1c, 1d, 1e, 1f, 1g, and 1h may be used.

The description above is intended to be illustrative and the present disclosure is not limited thereto. Therefore, it would be obvious to those skilled in the art that various modifications to the embodiments of the present disclosure would be possible without departing from the spirit and the scope of the appended claims. Further, it would be also obvious to those skilled in the art that embodiments of the present disclosure would be appropriately combined.

The terms used throughout the present specification and the appended claims should be interpreted as non-limiting terms unless clearly described. For example, terms such as "comprise", "include", "have", and "contain" should not be interpreted to be exclusive of other structural elements. Further, indefinite articles "a/an" described in the present specification and the appended claims should be interpreted to mean "at least one" or "one or more." Further, "at least one of A, B, and C" should be interpreted to mean any of A, B, C, A+B, A+C, B+C, and A+B+C as well as to include combinations of the any thereof and any other than A, B, and C.

What is claimed is:

1. An extreme ultraviolet light generation apparatus comprising:
   a chamber;
   a first partition wall covering a plasma generation region in the chamber and having a first opening;
   an EUV light concentrating mirror located in a first space inside the chamber and outside the first partition wall and configured to concentrate extreme ultraviolet light generated in the plasma generation region and having passed through the first opening;
   a first gas supply port formed at the chamber and configured to supply gas to the first space; and a gas exhaust port formed in the first partition wall and configured to exhaust gas in a second space inside the first partition wall to outside of both the first partition wall and the chamber.

2. The extreme ultraviolet light generation apparatus according to claim 1,
wherein the EUV light concentrating mirror is arranged such that the first opening is located outside an optical path of the extreme ultraviolet light reflected by the EUV light concentrating mirror.

3. The extreme ultraviolet light generation apparatus according to claim 1, further comprising:
a second partition wall that separates the first space into a third space and a fourth space; and
a second gas supply port formed at the chamber and configured to supply gas to the fourth space,
wherein the first gas supply port is configured to supply gas to the third space,
the first partition wall has a second opening, the first opening provides communication between the third space and the second space, and
the second opening provides communication between the fourth space and the second space.

4. The extreme ultraviolet light generation apparatus according to claim 3,
wherein the second opening allows pulse laser light to pass therethrough so as to be incident on the plasma generation region.

5. The extreme ultraviolet light generation apparatus according to claim 4,
further comprising a target supply unit configured to supply a target substance to the plasma generation region,
wherein the first partition wall has a third opening,
the third opening provides communication between the fourth space and the second space, and
the third opening allows the target substance to pass therethrough.

6. The extreme ultraviolet light generation apparatus according to claim 4,
wherein the first partition wall has a fourth opening,
the fourth opening provides communication between the fourth space and the second space, and
the fourth opening allows light for observing a part of the second space to pass therethrough.

7. The extreme ultraviolet light generation apparatus according to claim 1,
further comprising a temperature adjustment device that adjusts temperature of the first partition wall.

8. The extreme ultraviolet light generation apparatus according to claim 1,
wherein coating that suppresses adhesion of the target substance is formed on a surface of the first partition wall.

9. The extreme ultraviolet light generation apparatus according to claim 1, further comprising:
a target supply unit configured to supply a target substance to the plasma generation region, and
a target collection unit arranged on the first partition wall and configured to collect the target substance having passed through the plasma generation region.

10. The extreme ultraviolet light generation apparatus according to claim 9,
wherein the first partition wall is configured such that gas in a fifth space, being a part of the second space, inside the chamber passes through a sixth space, being another part of the second space, outside the chamber, and is exhausted to outside of the first partition wall, and
a movement direction of the gas from the fifth space to the sixth space coincides with the gravity direction.

11. The extreme ultraviolet light generation apparatus according to claim 10,
further comprising an exhaust pipe connected to the gas exhaust port and configured to guide gas in the sixth space in a direction intersecting the gravity direction to exhaust the gas.

12. The extreme ultraviolet light generation apparatus according to claim 1,
wherein the first partition wall penetrates a wall of the chamber, and
a flange fixed to the wall of the chamber from the outside of the chamber is formed around the first partition wall.

13. The extreme ultraviolet light generation apparatus according to claim 12,
further comprising a second partition wall separating the first space into a third space in which the EUV light concentrating mirror is located and a fourth space in contact with the first partition wall, and having a fifth opening through which the extreme ultraviolet light generated in the plasma generation region passes toward the EUV light concentrating mirror 23b,
wherein the first partition wall around the first opening and the second partition wall around the fifth opening are close to each other.

14. The extreme ultraviolet light generation apparatus according to claim 13,
wherein an end part of the first partition wall and a surface of the second partition wall on a side of the fourth space face each other.

15. The extreme ultraviolet light generation apparatus according to claim 13,
further comprising an elastic body sandwiched between the first partition wall around the first opening and the second partition wall around the fifth opening.

16. The extreme ultraviolet light generation apparatus according to claim 15,
wherein the elastic body provides gas sealing between the first partition wall around the first opening and the second partition wall around the fifth opening.

17. The extreme ultraviolet light generation apparatus according to claim 15,
wherein the elastic body is fixed to one of the first partition wall and the second partition wall and is pressed against the other thereof.

18. The extreme ultraviolet light generation apparatus according to claim 13,
wherein the first partition wall around the first opening and the second partition wall around the fifth opening are separated apart from each other.

19. An electronic device manufacturing method, comprising:
generating extreme ultraviolet light using an extreme ultraviolet light generation apparatus;
emitting the extreme ultraviolet light to an exposure apparatus; and
exposing a photosensitive substrate to the extreme ultraviolet light in the exposure apparatus to manufacture an electronic device,
the extreme ultraviolet light generation apparatus including:
a chamber;

a first partition wall covering a plasma generation region in the chamber and having a first opening;

an EUV light concentrating mirror located in a first space inside the chamber and outside the first partition wall and configured to concentrate the extreme ultraviolet light generated in the plasma generation region and having passed through the first opening;

a first gas supply port formed at the chamber and configured to supply gas to the first space; and a gas exhaust port formed in the first partition wall and configured to exhaust gas in a second space inside the first partition wall to outside of both the first partition wall and the chamber.

20. An electronic device manufacturing method, comprising:

inspecting a defect of a mask by irradiating the mask with extreme ultraviolet light generated by an extreme ultraviolet light generation apparatus;

selecting a mask using a result of the inspection; and exposing and transferring a pattern formed on the selected mask onto a photosensitive substrate, the extreme ultraviolet light generation apparatus including:

a chamber;

a first partition wall covering a plasma generation region in the chamber and having a first opening;

an EUV light concentrating mirror located in a first space inside the chamber and outside the first partition wall and configured to concentrate the extreme ultraviolet light generated in the plasma generation region and having passed through the first opening;

a first gas supply port formed at the chamber and configured to supply gas to the first space; and a gas exhaust port formed in the first partition wall and configured to exhaust gas in a second space inside the first partition wall to outside of both the first partition wall and the chamber.

* * * * *